(12) United States Patent
Soneda et al.

(10) Patent No.: US 9,325,129 B2
(45) Date of Patent: Apr. 26, 2016

(54) POWER STRIP AND ELECTRIC POWER MEASUREMENT SYSTEM

(75) Inventors: Hiromitsu Soneda, Kawasaki (JP);
Osamu Tsuboi, Kawasaki (JP);
Fumihiko Nakazawa, Kawasaki (JP);
Naoyuki Nagao, Tokyo (JP)

(73) Assignees: FUJITSU LIMITED, Kawasaki (JP);
FUJITSU COMPONENT LIMITED, Tokyo (JP)

( * ) Notice: Subject to any disclaimer, the term of this patent is extended or adjusted under 35 U.S.C. 154(b) by 464 days.

(21) Appl. No.: 13/009,292

(22) Filed: Jan. 19, 2011

(65) Prior Publication Data
US 2011/0187348 A1 Aug. 4, 2011

(30) Foreign Application Priority Data
Jan. 29, 2010 (JP) .................................. 2010-019166

(51) Int. Cl.
*G01R 33/07* (2006.01)
*H01R 25/00* (2006.01)
*H01R 13/66* (2006.01)
(Continued)

(52) U.S. Cl.
CPC .............. *H01R 25/003* (2013.01); *G01R 21/06* (2013.01); *H01R 13/6658* (2013.01); *H01R 13/6683* (2013.01); *G01R 15/202* (2013.01); *G01R 15/207* (2013.01); *G01R 33/07* (2013.01); *H01L 2924/181* (2013.01); *H01R 2103/00* (2013.01)

(58) Field of Classification Search
CPC ........ G06F 1/26; G01R 15/202; G01R 33/07; G01R 15/207

USPC ....................................................... 324/117 H
See application file for complete search history.

(56) References Cited

U.S. PATENT DOCUMENTS 5,583,429 A * 12/1996 Otaka .................. G01R 15/202
324/117 H
5,831,425 A 11/1998 Ochiai
(Continued)

FOREIGN PATENT DOCUMENTS

JP 09-084146 * 3/1997
JP 9-084146 A 3/1997
(Continued)

OTHER PUBLICATIONS

Paul Emerald, "Non-Intrusive Hall-Effect Current-Sensing Techniques Provide Safe, Reliable Detection and Protection for Power Electronics", May 6, 1998, Allegro. http://www.allegromicro.com/en/Design-Center/Technical-Documents/Hall-Effect-Sensor-IC-Publications/Non-Intrusive-Hall-Effect-Current-Sensing-Techniques-for-Power-Electronics.aspx.*

(Continued)

*Primary Examiner* — Patrick Assouad
*Assistant Examiner* — Christopher McAndrew
(74) *Attorney, Agent, or Firm* — Westerman, Hattori, Daniels & Adrian, LLP

(57) ABSTRACT

The following disclosure provides a power strip including: a busbar electrically connected to a power source; multiple electrical outlets allowing multiple power plugs to be inserted thereinto, respectively; distribution bars which are branched out from the busbar and respectively supply the electrical outlets with electric currents of the power source; and a plurality of electric current measurement units each configured to measure the electric current flowing through a corresponding one of the distribution bars.

4 Claims, 34 Drawing Sheets

(51) Int. Cl.
  *G01R 21/06* (2006.01)
  *G01R 15/20* (2006.01)
  *H01R 103/00* (2006.01)

(56) References Cited

U.S. PATENT DOCUMENTS

| | | | |
|---|---|---|---|
| 6,220,880 B1 * | 4/2001 | Lee | H01R 25/003 439/214 |
| 6,445,186 B1 | 9/2002 | Damadian et al. | |
| 6,445,188 B1 | 9/2002 | Lutz et al. | |
| 6,545,456 B1 * | 4/2003 | Radosevich | G01R 33/07 324/117 H |
| 7,043,543 B2 * | 5/2006 | Ewing | G06F 1/26 307/11 |
| 7,581,977 B1 * | 9/2009 | Wu | H01R 13/7036 439/106 |
| 7,630,186 B2 * | 12/2009 | Reynolds | G06F 1/30 361/93.1 |
| 7,973,425 B2 * | 7/2011 | Chen | H01R 13/70 307/12 |
| 8,093,889 B2 * | 1/2012 | Ariyama | G01R 33/07 324/117 H |
| 8,624,583 B2 * | 1/2014 | Clegg | G01R 19/00 324/117 H |
| 2002/0002593 A1 | 1/2002 | Ewing et al. | |
| 2005/0101193 A1 * | 5/2005 | Godard | H01R 25/00 439/652 |
| 2014/0077797 A1 * | 3/2014 | Nagao | G01R 19/15 324/253 |

FOREIGN PATENT DOCUMENTS

| | | |
|---|---|---|
| JP | 11-121067 A | 4/1999 |
| JP | 11-313441 A | 11/1999 |
| JP | 2001-066330 A | 3/2001 |
| JP | 3082339 U | 9/2001 |
| JP | 2002-98715 A | 4/2002 |
| JP | 2003-317850 A | 11/2003 |
| JP | 2006-109389 A | 4/2006 |
| JP | 2009-218121 A | 9/2009 |
| KR | 10-2009-0129531 A | 12/2009 |

OTHER PUBLICATIONS

Chinese Office Action dated Jan. 22, 2013, issued in corresponding Chinese patent application No. 201110034827.0, w/ English translation.
Japanese Office Action dated Nov. 12, 2013, issued in Japanese Patent Application No. 2010-019166, w/English translation.
Chinese Office Action dated Sep. 2, 2013 issued in corresponding Chinese Patent Application No. 201110034827.0. English Translation (12 pages).
Extended European Search Report dated May 9, 2014, issued in corresponding European Patent Application No. 11152424.5 (10 pages).
Office Action dated Sep. 14, 2015 issued in counterpart European Patent Application No. 11 152 424.5 (8 pages).

* cited by examiner

POWER STRIP AND ELECTRIC POWER MEASUREMENT SYSTEM

CROSS-REFERENCE TO RELATED APPLICATIONS

This application is based upon and claims the benefit of priority of the prior Japanese Patent Application No. 2010-019166, filed on Jan. 29, 2010, the entire contents of which are incorporated herein by reference.

FIELD

It is related to a power strip and an electric power measurement system.

BACKGROUND

In recent years, there is a growing trend to save power consumption at home and office, in consideration of increasing electric power demand and the global environment. Along with the growth of the energy saving trend, efforts are made to frequently turn off electronic devices, to review the temperature set for air conditioning, and the like.

Various methods for measuring power consumption are proposed to figure out how much energy saving is actually achieved by such efforts.

However, any one of these methods has difficulty in accurately measuring power consumption of each of electronic devices.

For example, there is proposed a method in which a terminal for measuring power consumption is provided to an outlet at home, and measures the power consumption of an electronic device connected to the outlet. When a power strip is connected to one wall outlet and is connected to multiple electronic devices, however, this method has a problem that the power strip is incapable of measuring the power consumption of each of the electronic devices individually even though the power strip can measure the total power consumption of the multiple electronic devices.

In another method, an electric current sensor for measuring a power consumption is provided to a power supply line upstream of power division by a distribution board in a house. This method, however, has no way to figure out how much electric power is consumed in each of power supply lines downstream of the power division by the distribution board.

Note that, techniques related to the present application are disclosed in Japanese Laid-open Patent Publication Nos. 09-84146, 11-313441, and 2001-663330.

SUMMARY

According to one aspect discussed herein, there is provided a power strip including, a busbar electrically connected to a power source, a plurality of electrical outlets into which a plurality of power plugs are respectively insertable, a plurality of distribution bars which are branched out from the busbar and respectively supply the plurality of electrical outlets with electric currents of the power source, a plurality of electric current measurement units respectively measuring the electric current flowing through the plurality of distribution bars.

According to another aspect discussed herein, there is provided a power strip including, a first busbar electrically connected to one pole of a power source, a plurality of first contacts formed integrally with the first busbar, the first contacts allowing one of two plug blades of a power plug to be inserted therebetween, a second busbar electrically connected to the other pole of the power source, holding pieces provided integrally with the second busbar, a plurality of distribution bars whose main surfaces are held between the holding pieces, a plurality of second contacts provided to the distribution bars, the second contacts allowing the other one of the two plug blades of the power plug to be inserted therebetween, and a plurality of electric current measurement units to measure an electric current flowing through a corresponding one of the distribution bars, wherein the first busbar and the second busbar are fabricated by bending conductive plates having a same planar shape in a bending process.

According to still another aspect discussed herein, there is provided an electric power measurement system including a plurality of electric current measurement units each configured to measure an electric current flowing through a corresponding one of a plurality of distribution bars which are branched out from a busbar of a power strip, and respectively supply a plurality of electrical outlets with a electric power, and a program to multiply a voltage of the electric power and each of the measured electric currents, and thereby to calculate an amount of power consumed by each of a plurality of electronic devices connected respectively to the plurality of electrical outlets.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

First Embodiment

Figure 1:
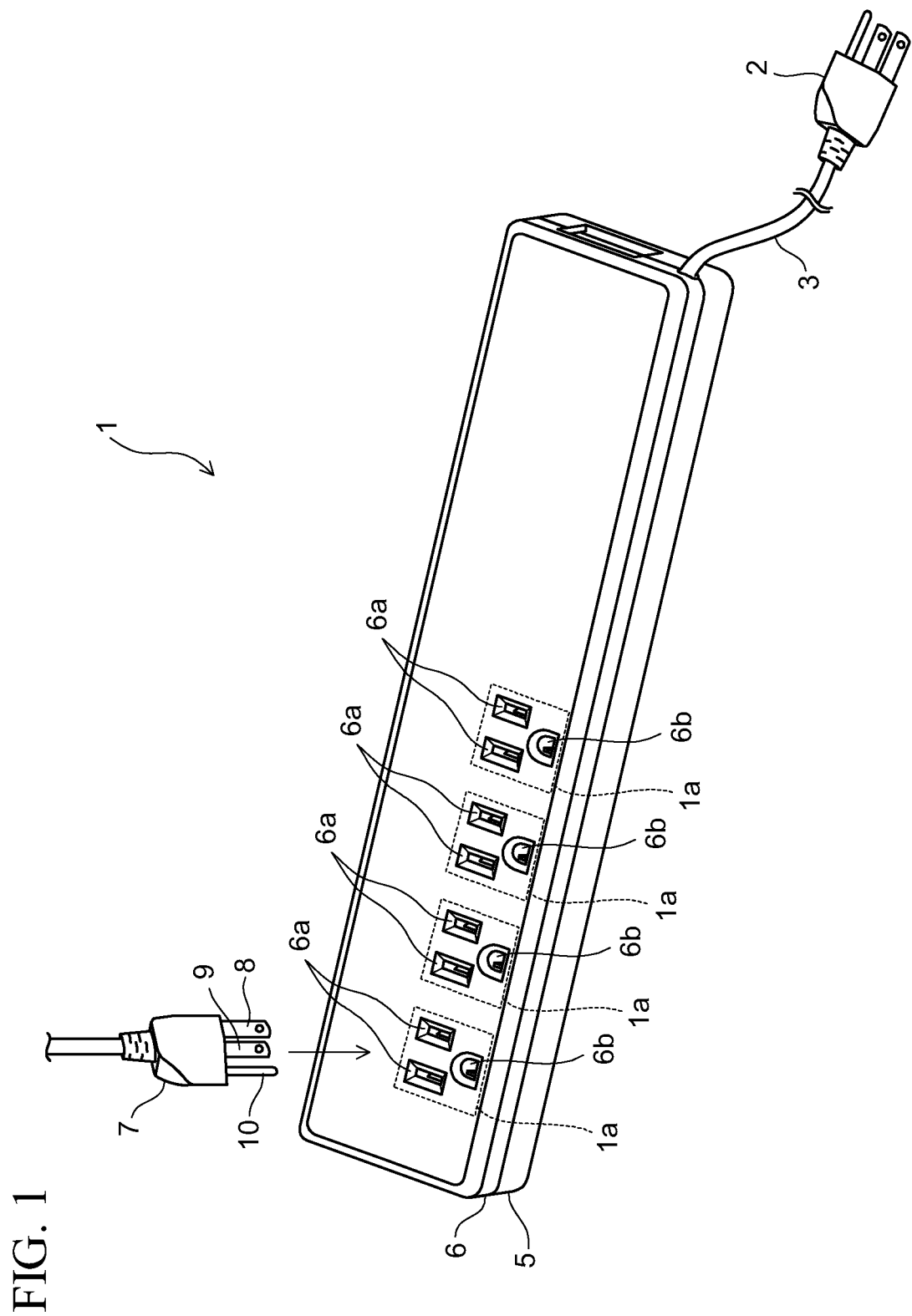
FIG. 1 is an external view of a power strip according to a first embodiment.

FIG. 1 is an external view of a power strip 1 according to a first embodiment.

The power strip 1 is used for distributing an alternating-current power source to multiple electrical outlets 1a. The alternating-current power source is supplied through a power plug 2 and a power supply cord 3. In addition, the power strip 1 has a bottom cover 5 and a top cover 6, which are made of resin and are screwed to each other.

Multiple pairs of first openings 6a and a second opening 6b, which correspond to the multiple electrical outlets 1a, are formed in the top cover 6. Each pair of the first openings 6a and the second opening 6b allows an external power plug 7 to be inserted thereinto.

Each of the first openings 6a has a substantially rectangular planar shape so as to allow a corresponding one of plug blades 8 and 9 of the power plug 7 to be inserted thereinto. In addition, each of the second openings 6b has a substantially semicircular planar shape so as to allow an earth terminal 10 to be inserted thereinto.

Figure 2:
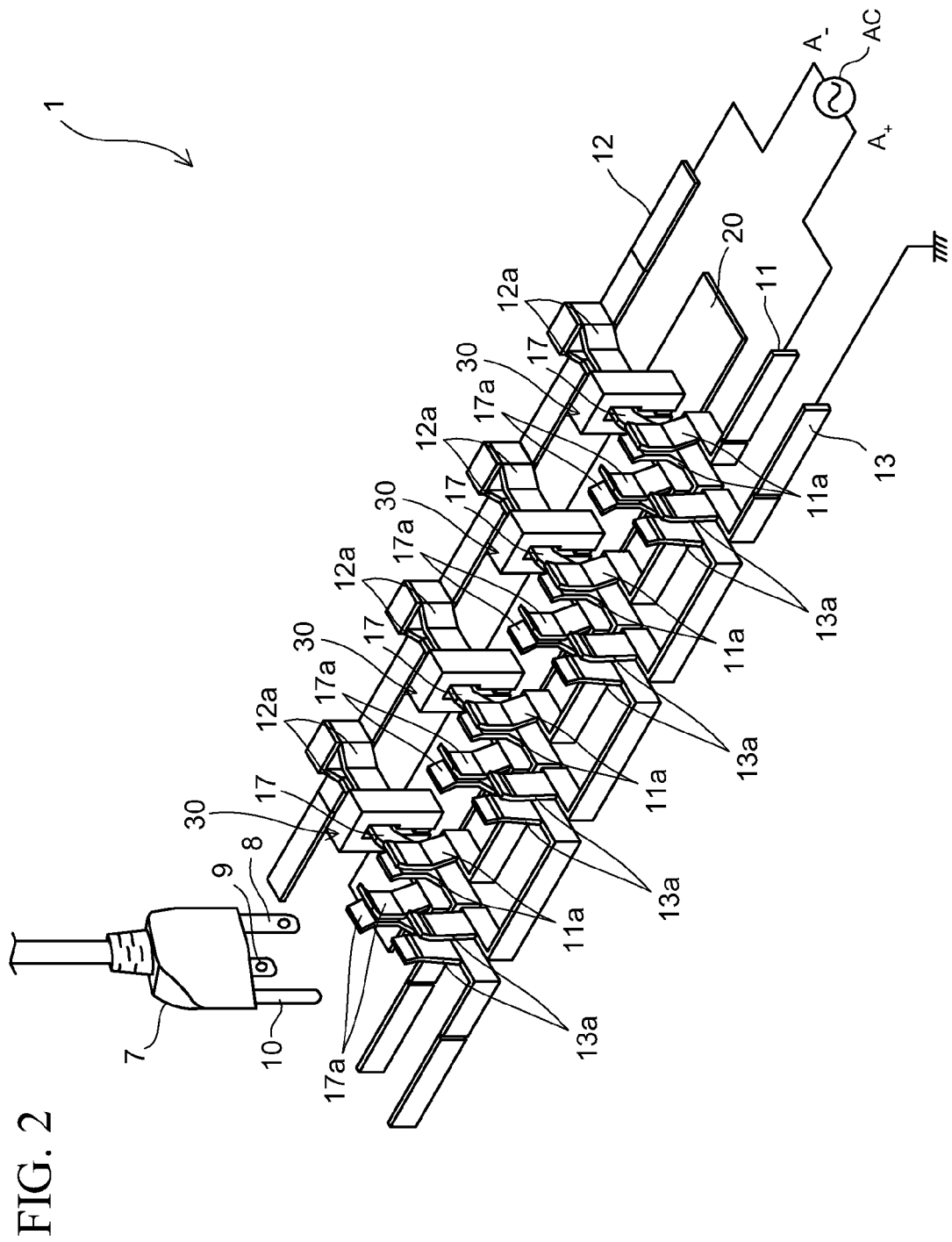
FIG. 2 is an external view of the power strip according to the first embodiment when the top and bottom covers of the power strip are removed.

FIG. 2 is an external view of the power strip according to the first embodiment when the top and bottom covers 5 and 6 are removed.

As illustrated in FIG. 2, first to third busbars 11 to 13 are provided in the power strip 1. The busbars 11 to 13 can be fabricated by subjecting a metal plate such as a brass plate to a punching process and then to a bending process, for example.

Among the busbars 11 to 13, the first busbar 11 and the second busbar 12 are electrically connected to the poles $A_+$ and $A_-$ of an alternating-current power source AC, respectively, through the power supply cord (see FIG. 1), while the third busbar 13 is kept at the ground potential through the power cord 3.

In addition, the first busbar 11 has multiple pairs of first contacts 11a, each of the pairs allowing the plug blade 8 among the plug blades 8 and 9 of the external power plug 7 to be inserted therebetween.

Meanwhile, the second busbar 12 has multiple pairs of holding pieces 12a arranged at constant intervals in the extending direction of the second busbar 12.

Each of the pairs of the holding pieces 12a holds the main surface of a distribution bar 17, and a pair of second contacts 17a is provided at an end portion of the distribution bar 17. Each pair of the second contacts 17a forms a pair with a corresponding one of the pairs of the first contacts 11a and also allows the plug blade 9 of the power plug 7 to be inserted therebetween.

The third busbar 13 has multiple pairs of third contacts 13a, and each of the pairs of the third contacts 13a allows the earth terminal 10 of the power plug 7 to be inserted therebetween.

A first circuit board 20 is provided below the distribution bars 17.

The first circuit board 20 is provided with multiple electric current measurement units 30 each configured to measure an electric current flowing through a corresponding one of the multiple distribution bars 17.

Figure 3:
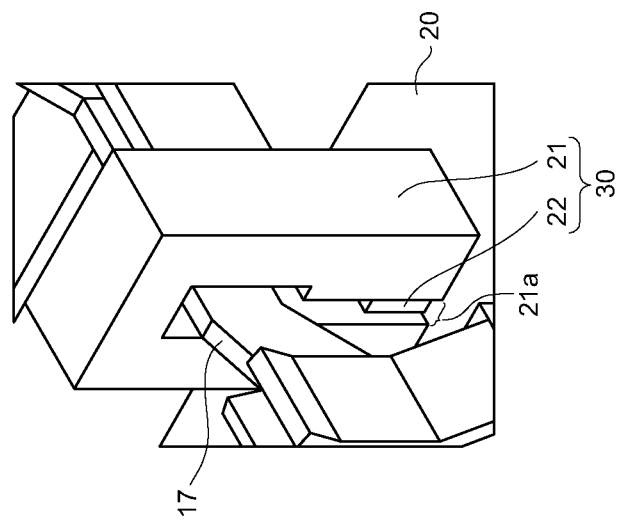
FIG. 3 is an enlarged perspective view of an electric current measurement unit and the vicinity thereof in the power strip according to the first embodiment.

FIG. 3 is an enlarged perspective view of each of the electric current measurement units 30 and the vicinity thereof.

Each of the electric current measurement units 30 includes a magnetic core 21 fixedly attached to the first circuit board 20 for a corresponding one of the distribution bars 17. The magnetic core 21 is formed so as to cause a magnetic field generated around the electric current flowing through the busbar 17 to converge and is formed in a substantially ring shape along the path of the magnetic field. The material of the magnetic core 21 is not limited to a particular substance, but ferrite, which is a relatively easily available substance, is used in this embodiment as the material of the magnetic core 21.

In addition, each of the electric current measurement units 30 includes a hall element 22 provided in a gap 21a of the magnetic core 21. The hall element 22 estimates, on the basis of the intensity of the magnetic field in the gap 21a, an electric current value flowing through the busbar 17, and is mounted on the first circuit board 20 by soldering or the like.

The multiple electric current measurement units 30 are provided on the first circuit board 20, which is a single piece of circuit board. Thus, reduction in the number of components and simplification of the assembly process can be achieved as compared with the case where circuit boards are provided for each of the electric current measurement units 30.

Figure 4:
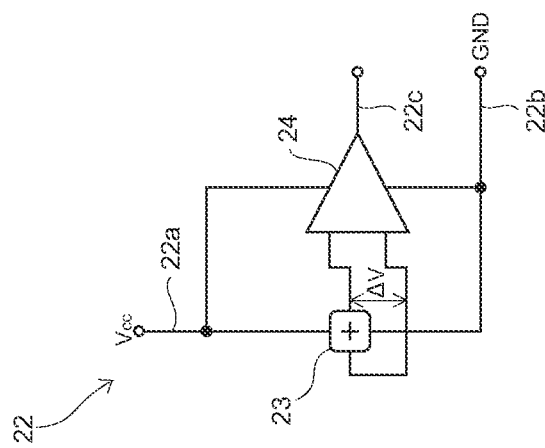
FIG. 4 is a circuit diagram of a hall element included in the power strip according to the first embodiment.

FIG. 4 is a circuit diagram of the hall element 22.

As illustrated in FIG. 4, the hall element 22 has a gallium arsenide based magnetic sensor 23 and an operational amplifier 24.

When exposed to a magnetic field in a state where a voltage Vcc is applied between a power supply terminal 22a and a ground terminal 22b, the magnetic sensor 23 generates a potential difference ΔV in accordance with the intensity of the magnetic field. The potential difference ΔV is amplified by the operational amplifier 24 and then is outputted to an outside from an output terminal 22c.

Figure 5:
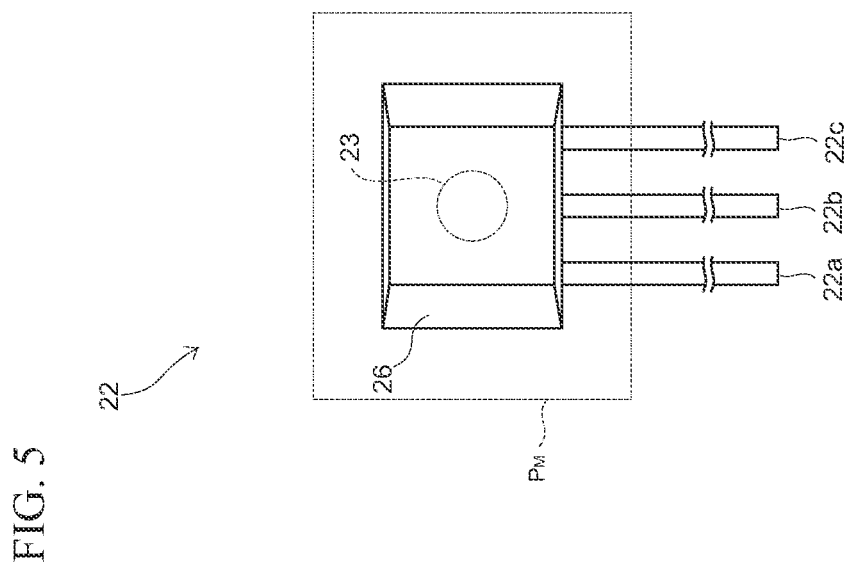
FIG. 5 is a plan view of a hall element included in the power strip according to the first embodiment.

FIG. 5 is a plan view of the hall element 22.

As illustrated in FIG. 5, the magnetic sensor 23 is sealed by resin 26 so as to be positioned within the plane of a magnetic sensitive surface $P_M$. Then, the hall element 22 detects a magnetic field component perpendicular to the magnetic sensitive surface $P_M$ in the magnetic field penetrating the magnetic sensor 23 and then outputs an output signal corresponding to the magnitude of the magnetic filed component from the output terminal 22c.

Note that, the terminals 22a to 22c are electrically connected to wiring in the first circuit board 20 (see FIG. 3) by soldering or the like.

The hall element 22 as described above is small in size as compared with another magnetic field measurement element such as a current transformer. Thus, there is no concern about an increase in size of the power strip with the hall element 22.

Further, the current transformer uses an inductive current, which is generated by a fluctuation of the magnetic field with time, to measure the magnitude of a magnetic field. Accordingly, the measuring object of the current transformer is limited to a magnetic field of alternating-current. Meanwhile, the hall element 22 has an advantage in that the intensity of a static magnetic field is measurable as well.

Moreover, the hall element 22 is inexpensive as compared with a current transformer. Accordingly, an increase in the cost of the power strip can be prevented with the hall element 22.

Figure 6:
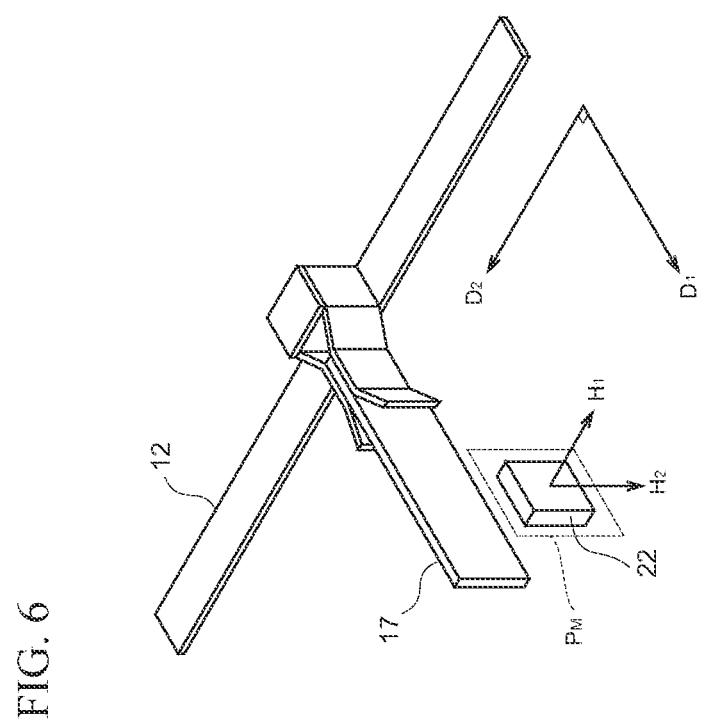
FIG. 6 is a perspective view for describing a positional relation between a magnetic sensitive surface of the hall element, a second busbar and a distribution bar in the power strip according to the first embodiment.

FIG. 6 is a perspective view for describing a positional relationship between the magnetic sensitive surface $P_M$ of the hall element 22 and each of the bars 12 and 17.

The magnetic sensitive surface $P_M$ is set so as to be in parallel with an extending direction $D_1$ of the distribution bar 17. With this setting, a magnetic field $H_1$ generated from the electric current flowing through the distribution bar 17 penetrates the magnetic sensitive surface $P_M$ in a substantially perpendicular direction. Thus, the current detection sensitivity of the hall element 22 improves with this configuration.

In addition, in this embodiment, the extending direction $D_1$ of the distribution bar 17 is set not to be in parallel with an extending direction $D_2$ of the second busbar 12. Accordingly, a magnetic field $H_2$ generated at the second busbar 12 does not penetrate the magnetic sensitive surface $P_M$ in a perpendicular direction. As a result, a risk that the hall element 22 provided for use in measuring the magnetic field $H_1$ generated at the distribution bar 17 accidentally detects the magnetic field $H_2$ generated at the second busbar 12 is reduced. Accordingly, occurrence of cross-talk, in which the influence of a magnetic field other than the magnetic field $H_1$ is included in the result of the magnetic field detection of the hall element 22, can be prevented. Thus, the measurement accuracy for the magnetic field $H_1$ by the hall element 22 improves.

Specifically, when the extending direction $D_1$ of the distribution bar 17 is set perpendicular to the extending direction $D_2$ of the second busbar 12, the magnetic sensitive surface $P_M$ becomes also perpendicular to the extending direction $D_2$. Thus, the magnetic field $H_2$ generated at the second busbar 12 has no component perpendicular to the magnetic sensitive surface $P_M$, so that the measurement accuracy for the magnetic field $H_1$ by the hall element 22 further improves.

Figure 7:
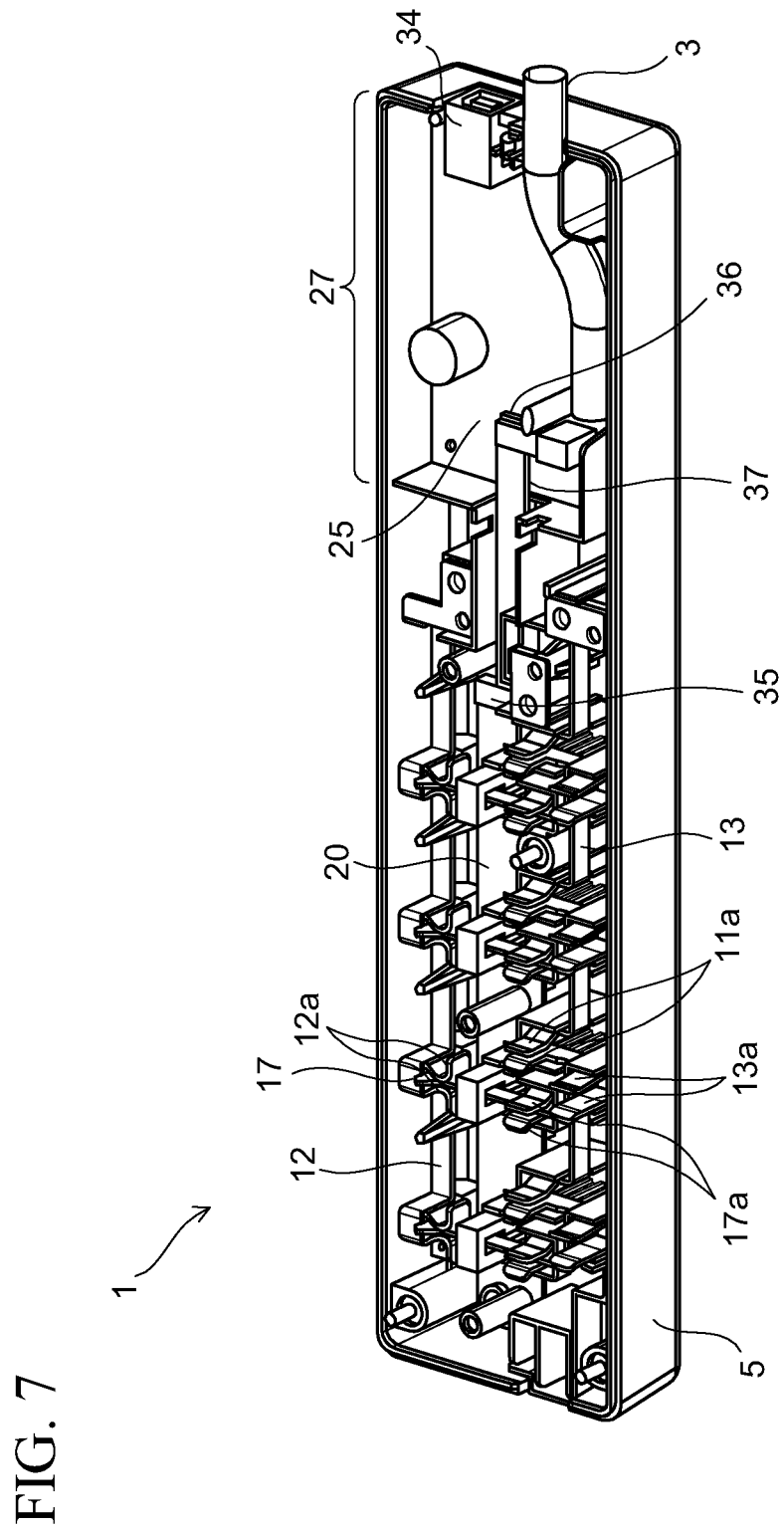
FIG. 7 is an external view of the power strip according to the first embodiment in a state where the top cover of the power strip is removed.

FIG. 7 is an external view of the power strip 1 in a state where the top cover 6 is removed.

As illustrated in FIG. 7, a transmission circuit portion 27 for housing a second circuit board 25 therein is allocated in the bottom cover 5.

The first and second circuit boards 20 and 25 are provided with connectors 35 and 36, respectively, and a communication cable 37 is connected between these connectors 35 and 36.

The communication cable 37 has a function to supply the first circuit board 20 with an electric power which is supplied through the power supply cord 3 and which is required for driving the hall elements 22 (see FIG. 3). The communication cable 37 also has a function to transmit an output signal of each of the hall elements 22 to the second circuit board 25.

Figure 8:
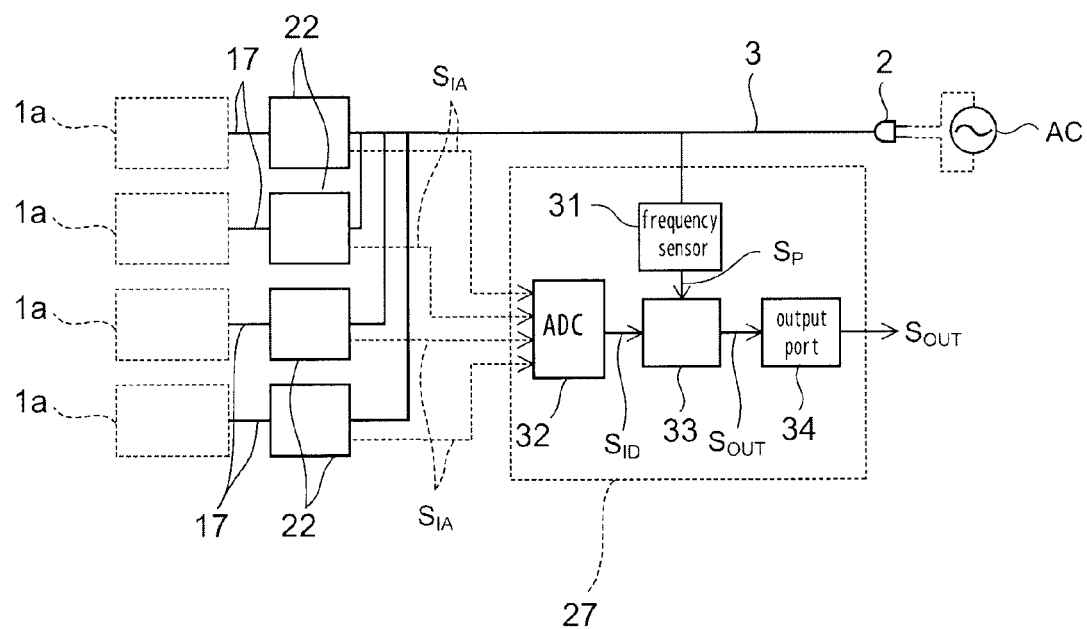
FIG. 8 is a functional block diagram of a transmission circuit portion included in the power strip according to the first embodiment.

FIG. 8 is a functional block diagram of the transmission circuit portion 27.

As illustrated in FIG. 8, the transmission circuit portion 27 has a frequency sensor 31, an AD converter 32, an arithmetic unit 33 and an output port 34. The frequency sensor 31 detects a frequency of the alternating-current power flowing through the power supply cord 3. The AD converter 32 digitalizes an analog signal outputted from the hall elements 22.

The transmission circuit portion 27 functions as follows.

Firstly, each of the hall elements 22 outputs an analog current signal $S_{IA}$ indicating an electric current flowing through a corresponding one of the distribution bars 17.

The analog current signal $S_{IA}$, which is an analog value, is digitalized by the AD converter 32 and becomes a digital current signal $S_{ID}$.

The frequency sensor 31 is a photocoupler, for example, and detects the frequency of the alternating-current power flowing through the power supply cord 3 connected to the alternating-current power source AC, and then outputs a frequency signal $S_P$ rising from "0" to "1" in synchronization with the frequency. For example, when the frequency of the alternating-current power is 50 Hz, the frequency signal $S_P$ also rises from "0" to "1" at the frequency of 50 Hz.

The arithmetic unit 33 measures the frequency at which the signal rises in the frequency signal $S_P$, and then identifies the frequency as a frequency T of the alternating-current power. Further, the arithmetic unit 33 uses 64/T as the sampling frequency and then receives the digital current signal $S_{ID}$ at the sampling frequency.

Note that, the arithmetic unit 33 is not limited to a particular processor, but an 8-bit MPU (Micro Processing Unit) is used as the arithmetic unit 33 in this embodiment.

Thereafter, the arithmetic unit 33 formats the digital current signal $S_{ID}$ to comply with the USB (Universal Serial Bus) standard and then outputs the formatted signal to the output port 34 as an output signal $S_{OUT}$.

Note that, the standard of the output signal $S_{OUT}$ is not limited to the USB standard, and the digital current signal $S_{ID}$ may be formatted to comply with an optional standard such as wired LAN (Local Area Network), wireless LAN or the like.

In addition, a multiplier may be provided to the arithmetic unit 33. In this case, the voltage of the alternating-current power source AC is multiplied by the digital current signal $S_{ID}$ to find the electric energy consumed by each of the electronic devices connected respectively to the distribution bars 17. In this case, the electric energy with respect to the distribution bars 17 is outputted as the output signal $S_{OUT}$.

Next, an electric power measurement system using the power strip 1 is described.

Figure 9:
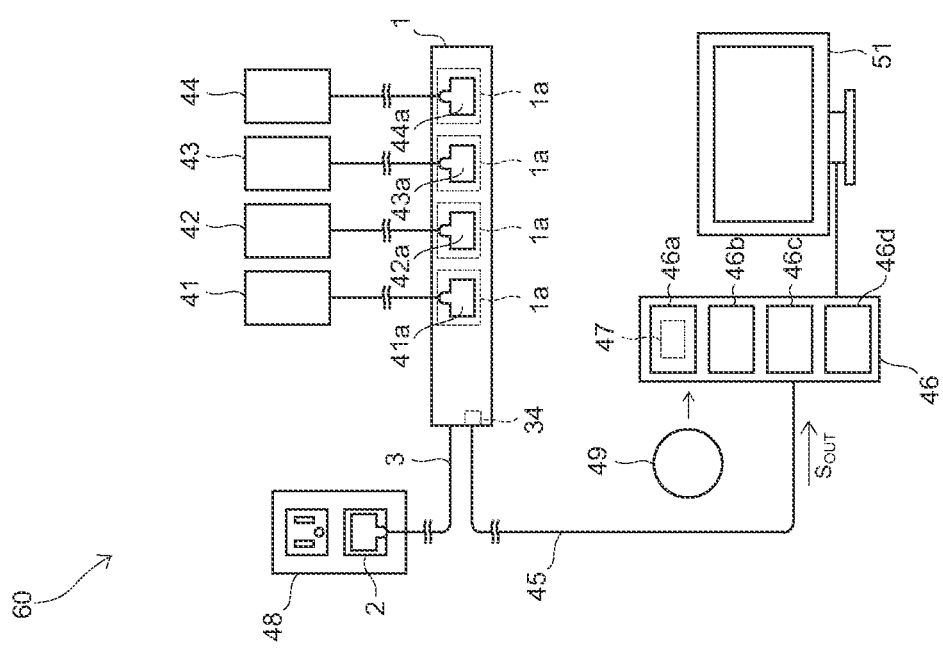
FIG. 9 is a schematic diagram for describing an electric power measurement system according to the first embodiment.

FIG. 9 is a schematic diagram for describing an electric power measurement system 60 according to this embodiment.

When the power strip 1 is used, the power plug 2 is inserted into a wall outlet 48 as illustrated in FIG. 9.

Then, power plugs 41a to 44a of first to fourth electronic devices 41 to 44 are inserted into the electrical outlets 1a of the power strip 1, respectively. Note that, it is not necessary to use all of the electrical outlets 1a for connecting electronic devices, and there may be an unused electrical outlet 1a among the multiple electrical outlets 1a.

Further, a signal cable 45 such as a USB cable is used to connect an electronic computer 46 such as a personal computer to the output port 34 of the power strip 1.

In this configuration, a value of the electric current supplied to each of the electronic devices 41 to 44 from the respective electrical outlets 1a is inputted to the electronic computer 46 as the output signal $S_{OUT}$.

The electronic computer 46 is provided with a storage unit 46a such as a hard disk drive. The storage unit 46a stores therein a program 47 for individually computing the electric power that is consumed by the respective electronic devices 41 to 44. Here, the program 47 computes the electric power by multiplying the voltage of the power source by the electric current included in the output signals $S_{OUT}$.

The method for storing the program 47 in the storage unit 46a is not limited to any particular method. For example, the electronic computer 46 may use an unillustrated CD (Compact Disk) drive or the like of the electronic computer 46 to read the program 47 stored in a recording medium 49 such as a CD and thereby to store the program 47 in the storage unit 46a.

When used, the program 47 is loaded into a RAM (Random Access Memory) 46b, and an arithmetic unit 46c such as a CPU calculates the power consumption of the electronic devices 41 to 44 individually for each of the electronic devices 41 to 44 by use of the program 46. Then, the result of the calculation is displayed on a monitor 51 for each of the electrical outlets 1a.

When a multiplier is provided to the arithmetic unit 33 (see FIG. 8), the aforementioned calculation does not have to be performed by the electronic computer 46, and the electrical energies included in the output signals $S_{OUT}$ for the respective electrical outlets 1a are displayed on the monitor 51.

Then, the user can monitor the monitor 51 and thereby realize in real time how much electric power is consumed by each of the electronic devices 41 to 44. The user can thus obtain information for determining whether or not to reduce, for the purpose of energy saving, the electric power consumed by each of the electronic devices 41 to 44.

In addition, a database 46d may be provided in the electronic computer 46, and the total electric power of the electronic devices 41 to 44 consumed in a predetermined period may be stored in the database 46d. Accordingly, additional information for determining whether or not to reduce the power can be obtained.

According to the embodiment described above, as described with reference to FIG. 9, the amounts of power consumption of the electronic devices 41 to 44 connected to the power strip 1 can be individually monitored.

Moreover, as described with reference to FIG. 6, the distribution bars 17 branch from the second busbar 12. Thus, the extending direction $D_1$ of the distribution bars 17 and the extending direction $D_2$ of the second busbar 12 are not in parallel with each other, so that a risk that the hall elements 22 accidentally measure the magnetic field $H_2$ generated at the second busbar 12 is reduced. As a result, the electric current flowing through each of the distribution bars 17 can be detected by a corresponding one of the hall elements 22 with high accuracy, and the reliability of the calculated value of the amount of the power consumption of each of the electronic devices 41 to 44 can be enhanced.

Second Embodiment

In this embodiment, a preferable positional relationship between the magnetic core 21 and the hall element 22 is described.

Figure 10:
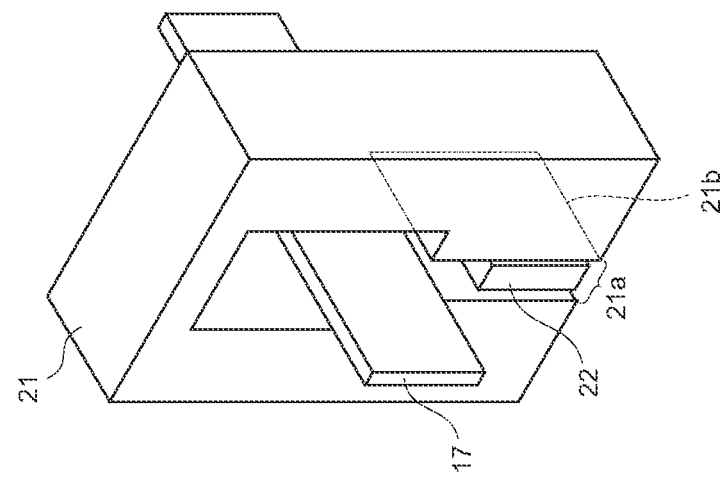
FIG. 10 is a perspective view for describing a simulation in a second embodiment.

FIG. 10 is a perspective view for describing a simulation performed by the inventors of the present application.

As illustrated in FIG. 10, the magnetic field intensity on a gap surface 21b of the magnetic core 21 which faces the gap 21a is simulated.

Figure 11B:
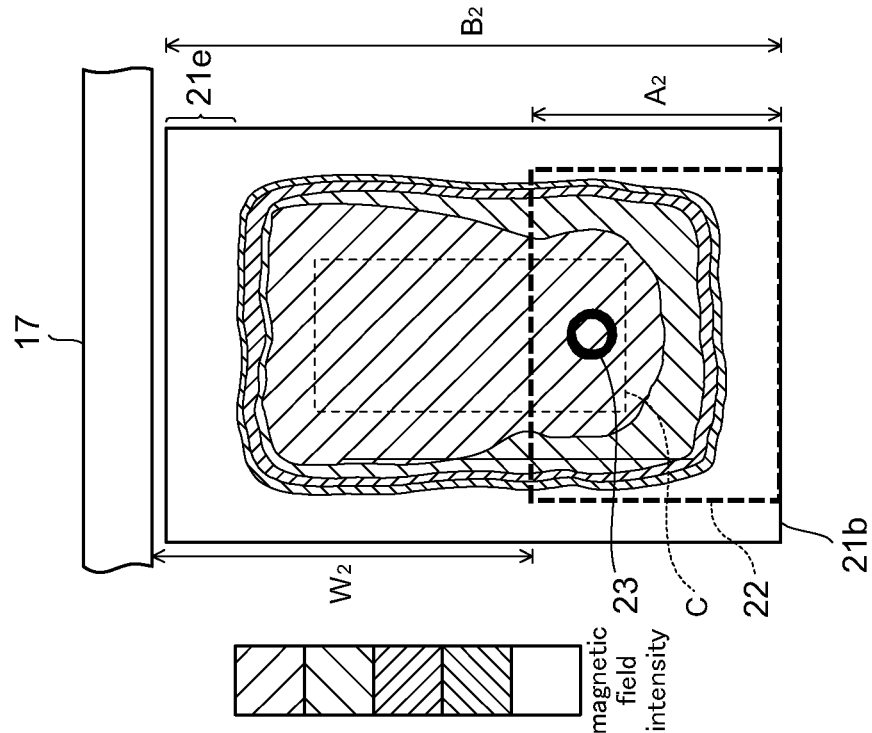
FIGS. 11A and 11B are diagrams each illustrating a simulation result of a magnetic field intensity in the second embodiment.
Figure 11A:
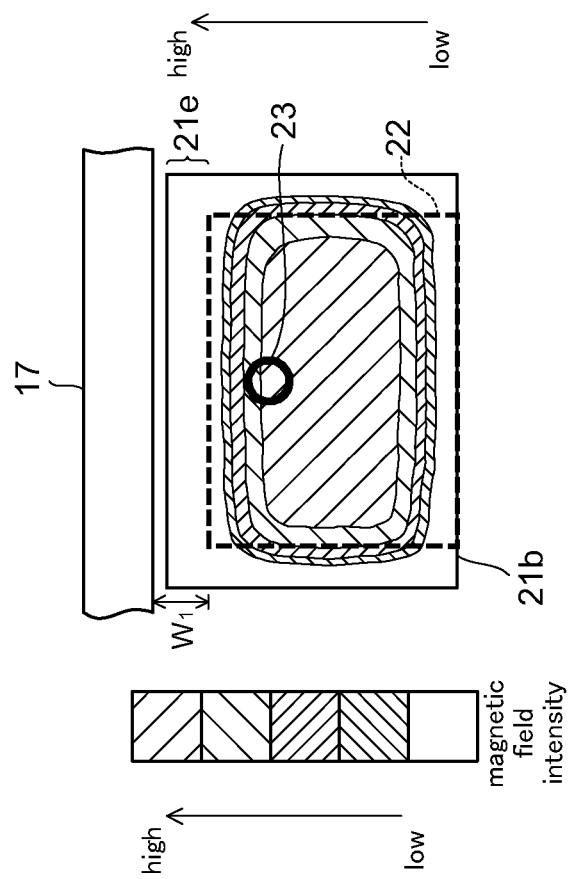

FIGS. 11A and 11B are diagrams each illustrating a simulation result thereof.

A distance $W_1$ between the distribution bar 17 and the hall element 22 in FIG. 11A is different from a distance $W_2$ between the distribution bar 17 and the hall element 22 in FIG. 11B. In FIG. 11A, the hall element 22 is arranged at a position closer to the distribution bar 17 than in FIG. 11B.

As illustrated in FIGS. 11A and 11B, it is verified that the magnetic field intensity is drastically reduced in an edge portion 21e of the gap surface 21b at a position closer to the distribution bar 17.

Based on the above finding, in order to ensure the measurement accuracy of the magnetic field detected by the hall element 22, it is preferable that the magnetic sensor 23 is positioned near the center of the gap surface 21b where a spatial fluctuation of the magnetic field is small.

However, when the hall element 22 is mounted on the first circuit board 20 (see FIG. 3), a certain amount of a positional shift is expected between the hall element 22 and the first circuit board 20. Therefore, it is difficult to accurately position the magnetic sensor 23, and the magnetic sensor 23 may be positioned out of the area near the center of the gap surface 21b. Specifically, when the distance $W_1$ is set smaller as illustrated in FIG. 11A, the magnetic sensor is more likely to be positioned in a region where the magnetic field is weak in the edge portion 21e. In this case, it is difficult to ensure the measurement accuracy of the magnetic field detected by the hall element 22.

To deal with this problem, the distance $W_2$ is preferably arranged as large as possible in considering the positional shift of the hall element 22 at the time of mounting the hall element 22, so that the magnetic sensor 23 is prevented from being positioned in the edge portion 21e even when the positional shift occurs. In this configuration, the magnetic sensor 23 is not located in the edge portion 21e but is surely located near a center portion C of the gap surface 21b. Thus, a spatially almost uniform magnetic field near the center portion C is measurable by the magnetic sensor 23, so that the measurement reliability of the magnetic field improves.

Furthermore, the area of the gap surface 21b may be made sufficiently larger than the area of the magnetic sensor 23. This configuration increases a region where the magnetic field is substantially uniform in the gap surface 21b, and accordingly can reduce a risk that the magnetic sensor 23 is positioned in a region where the magnetic field spatially drastically changes such as in the edge portion 21e. Thus, the measurement accuracy of the magnetic field detected by the hall element 22 can be improved.

However, when the distance $W_2$ is too large due to the increase in the area of the gap surface 21b, the magnetic sensor 23 is positioned excessively apart from the distribution bar 17. In this case, there arises a concern that the detection sensitivity of the hall element 22 of the magnetic field decreases because the magnetic field intensity at the magnetic sensor 23 is reduced.

To deal with this problem, a height $B_2$ of the gap surface 21a is preferably kept around 1.5 to 2.5 times of a height $A_2$ of the hall element 22 in order to prevent the magnetic field at the magnetic sensor 23 from being weakened due to the increase in the distance $W_2$.

Third Embodiment

The present embodiment is different from the first embodiment only in the form of the distribution bar 17, and the other configuration of the present embodiment is the same as that of the first embodiment.

Figure 12:
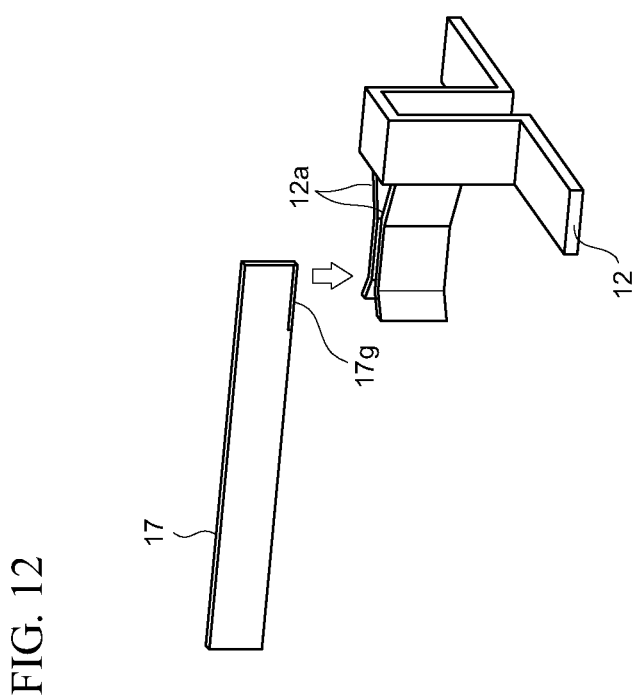
FIG. 12 is an enlarged perspective view of a distribution bar and a second busbar according to a third embodiment.

FIG. 12 is an enlarged perspective view of the distribution bar 17 and the second busbar 12 according to the present embodiment.

As illustrated in FIG. 12, the distribution bar 17 is inserted between the pair of holding pieces 12a of the second busbar 12 during the assembly process. Here, the portion of the distribution bar 17, which is to be held between the holding pieces 12a, is preferably chamfered in advance to form a chamfered portion 17g at a corner portion of the distribution bar 17. In this configuration, the chamfered portion 17g is allowed to be in sliding contact with the holding pieces 12a, thereby allowing the distribution bar 17 to be smoothly and easily inserted between the pair of the holding pieces 12a during the assembly process.

The method for forming the chamfered portion 17g is not particularly limited. However, an embossing process using a mold is preferably used to form the chamfered portion 17g in considering that this method takes less machining time than a cutting process.

Fourth Embodiment

This embodiment is different from the first embodiment only in the form of the distribution bar 17, and the other configuration of the embodiment is the same as that of the first embodiment.

Figure 13:
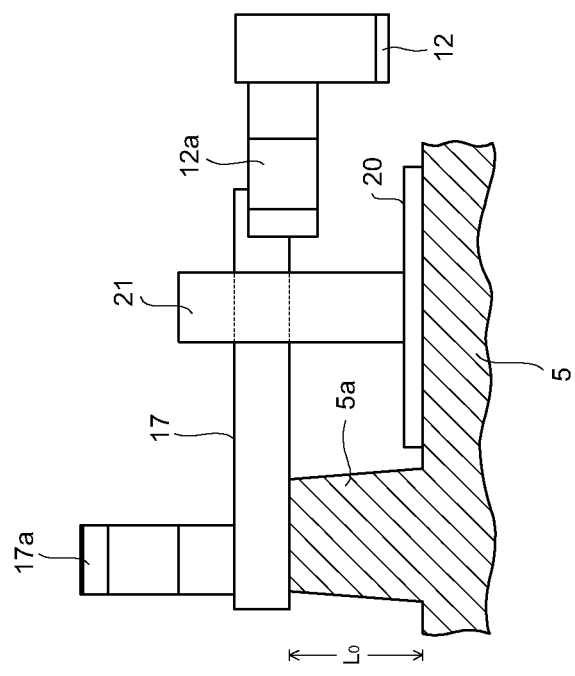
FIG. 13 is a side view of a distribution bar and a second busbar according to a fourth embodiment.

FIG. 13 is a side view of the distribution bar 17 and the second busbar 12.

In the example of FIG. 13, the distribution bar 17 is linearly formed. The linearly formed distribution bar 17 is supported by ribs 5a of the bottom cover 5, each of the ribs 5a having a height $L_0$.

Figure 14A:
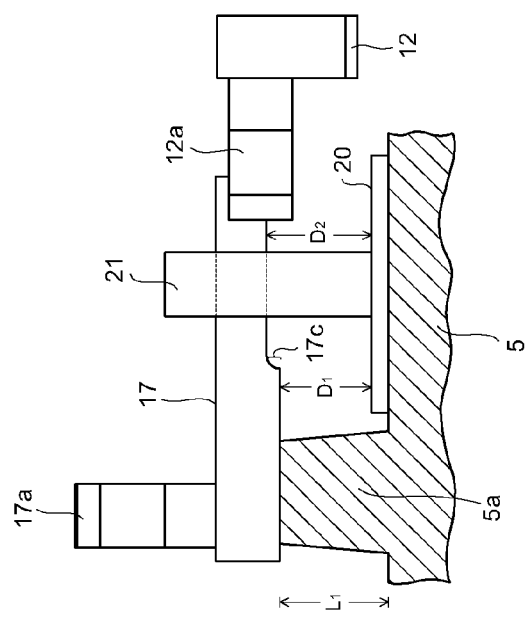
FIGS. 14A and 14B are each side views illustrating a case where a distribution bar is formed nonlinearly in the fourth embodiment.
Figure 14B:
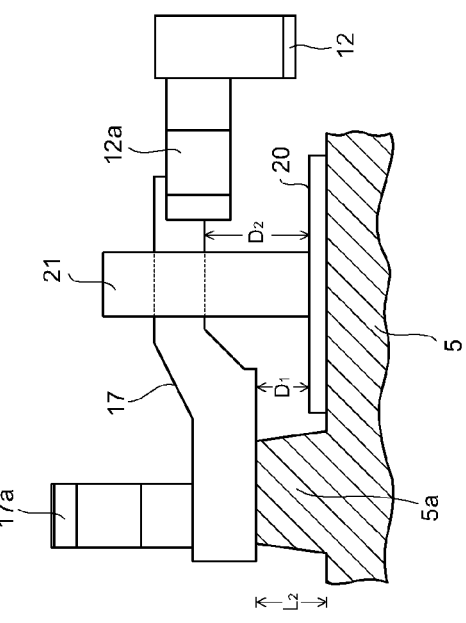

FIGS. 14A and 14B are each side views illustrating the case where the distribution bar 17 is formed nonlinearly.

In the example of FIG. 14A, an extension portion 17c extending toward the first circuit board 20 is provided to the distribution bar 17 on a side near the second contacts 17a.

In this configuration, a distance $D_1$ between the first circuit board 20 and the distribution bar 17 near the second contacts 17a is made smaller than a distance $D_2$ between the first circuit board 20 and the distribution bar 17 near the second busbar 12.

Thus, a height $L_1$ of the ribs 5a supporting the distribution bar 17 is made smaller than the height $L_0$ in FIG. 13. Thus, the bottom cover 5 can be formed thinner in this configuration.

Meanwhile, in the example of FIG. 14B, the distribution bar 17 is formed in a bridge shape, so that the distribution bar 17 near the second contact 17a can be positioned closer to the first circuit board 20. In this configuration as well, the distance $D_1$ is made smaller than the distance $D_2$. Thus, a height $L_2$ of the ribs 5a can be made smaller than the height $L_0$ in FIG. 13. Accordingly, it is possible to achieve a reduction in the thickness of the bottom cover 5 in this configuration.

Fifth Embodiment

Figure 15:
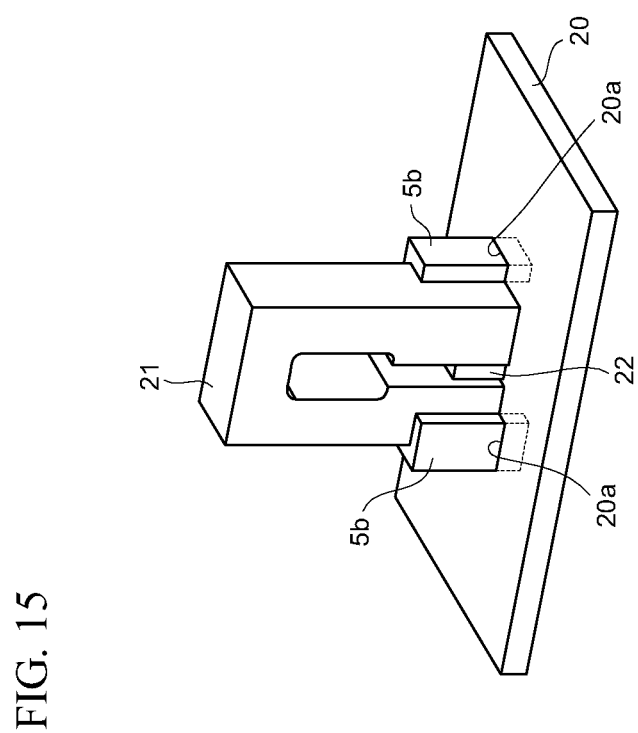
FIG. 15 is a perspective view illustrating a magnetic core according to a fifth embodiment and an area around the magnetic core.

FIG. 15 is a perspective view illustrating the magnetic core 21 according to the present embodiment and an area around the magnetic core 21.

The present embodiment is different from the first embodiment only in the attachment method for the magnetic core 21, and the other configuration of the present embodiment is the same as that of the first embodiment.

As illustrated in FIG. 15, in this embodiment, openings 20a are formed in the first circuit board 20, and L-shaped ribs 5b are respectively inserted into the openings 20a.

The method for forming the L-shaped ribs 5b is not particularly limited. However, it is preferable to vertically form the L-shaped ribs 5b integrally with the bottom cover 5 on the inner surface of the bottom cover 5 (see FIG. 7) in consideration of reduction in the number of components.

Figure 16:
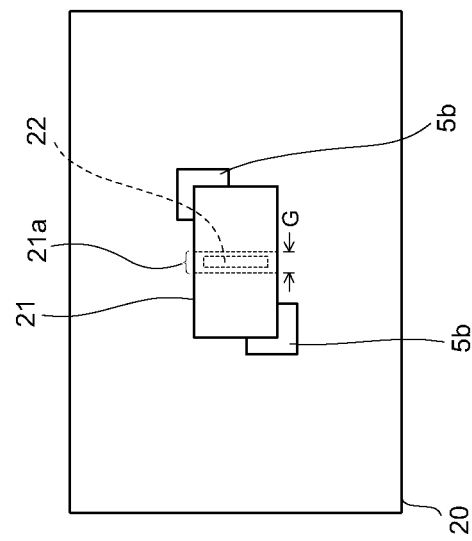
FIG. 16 is a top view of a first circuit board in the fifth embodiment as viewed from above the magnetic core.

FIG. 16 is a top view of the first circuit board 20 as viewed from above the magnetic core 21.

As illustrated in FIG. 16, the two L-shaped ribs 5b are provided diagonally with respect to the magnetic core 21 having a rectangular shape in a cross-sectional view. Here, the two L-shaped ribs 5b cooperatively hold the magnetic core 21.

Accordingly, the magnetic core 21 no longer has to be adhered to the first circuit board 20, and the number of steps required for the adhesion can be reduced.

Moreover, the magnetic core 21 is not fixed onto the first circuit board 20 in this structure. Thus, even when the first circuit board 20 thermally expands, a fluctuation in a width G of the gap 21a following the thermal expansion does not occur. Thus, a change in the magnetic field in the gap 21a caused by a fluctuation in the width G can be suppressed. Accordingly, the measurement accuracy of the magnetic field detected by the hall element 22 can be maintained.

Sixth Embodiment

Figure 17:
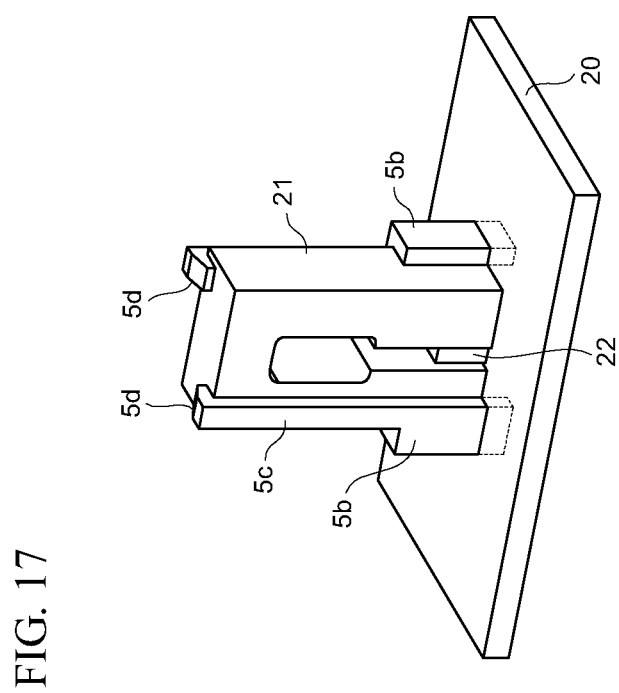
FIG. 17 is a perspective view illustrating a magnetic core according to a sixth embodiment and an area around the magnetic core.

FIG. 17 is a perspective view illustrating the magnetic core 21 and an area around the magnetic core 21.

The present embodiment is different from the fifth embodiment only in the form of the ribs 5b, and the other configuration of the present embodiment is the same as that of the fifth embodiment.

As illustrated in FIG. 17, an extension portion 5c is provided to each of the L-shaped ribs 5b, and a pawl 5d is further formed at a tip end of the extension portion 5c.

Figure 18:
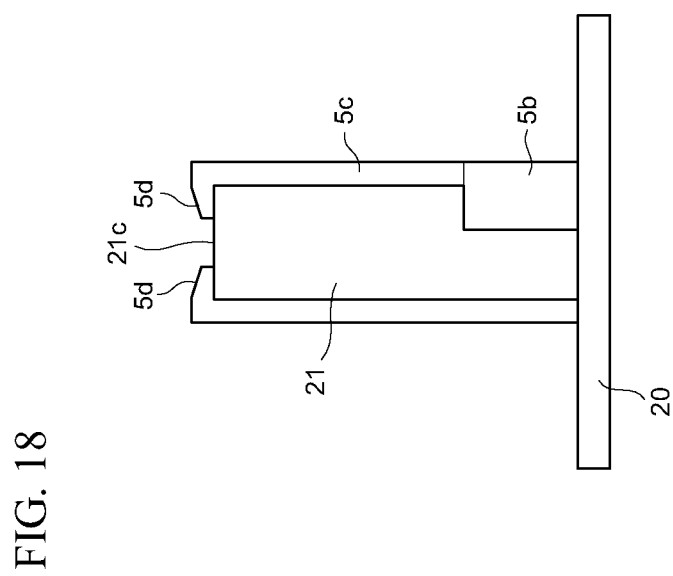
FIG. 18 is a side view of the magnetic core and L-shaped ribs according to the sixth embodiment.

FIG. 18 is a side view of the magnetic core 21 and the L-shaped ribs 5b.

As illustrated in FIG. 18, the pawl 5d is provided to hold a top surface 21c of the magnetic core 21.

Here, the magnetic core 21 is pressed against the first circuit board 20 by the pawls 5d provided to the L-shaped ribs 5d. Thus, the magnetic core 21 can be prevented from being displaced from the L-shaped ribs 5b.

Seventh Embodiment

Figure 19:
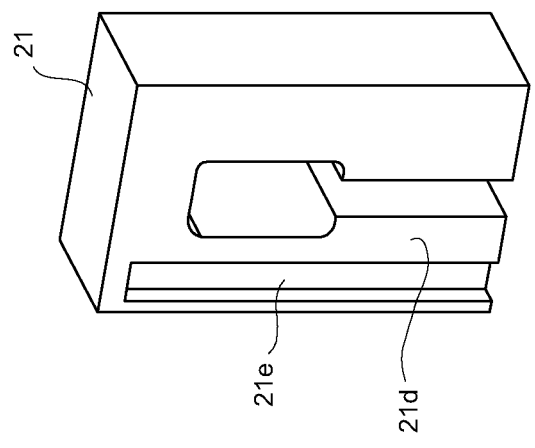
FIG. 19 is a perspective view of a magnetic core according to a seventh embodiment.

FIG. 19 is a perspective view of the magnetic core 21 according to the present embodiment.

In the present embodiment, grooves 21e are provided respectively to side surfaces 21d of magnetic core 21 as illustrated in FIG. 19. The other configuration of the present embodiment is the same as that of the sixth embodiment.

Figure 20:
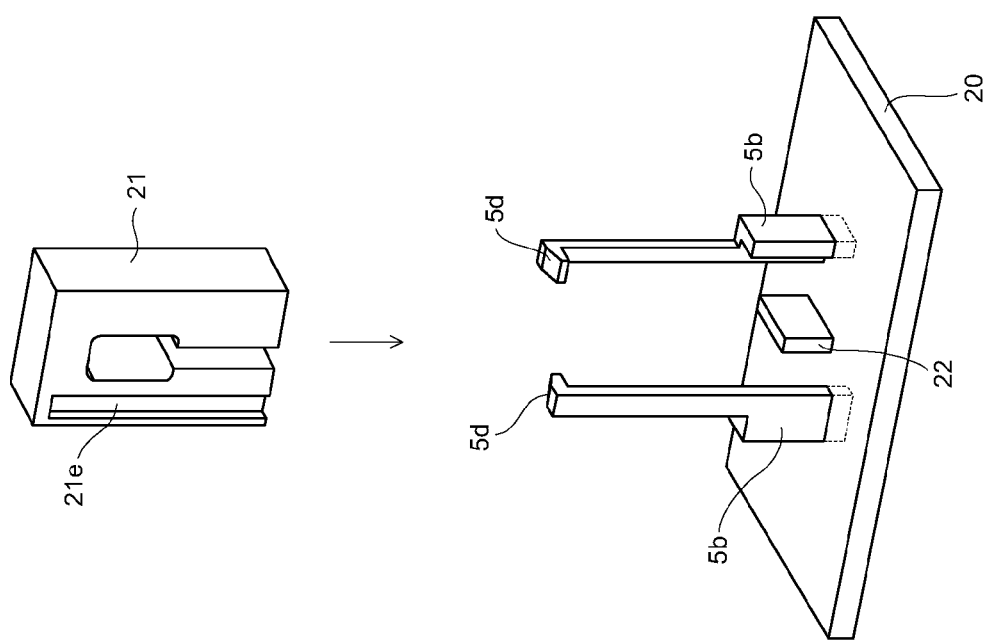
FIG. 20 is a perspective view illustrating how the magnetic core is attached to a first circuit board in the seventh embodiment.

FIG. 20 is a perspective view illustrating how the magnetic core 21 is attached to the first circuit board 20.

Each of the grooves 21e has a width and a depth large enough to allow the pawl 5d to fit into the groove 21e. Thus, when the magnetic core 21 is moved down toward the first circuit board 20 in the course of the attachment, the pawls 5d are placed inside the grooves 21e. Accordingly, the magnetic core 21 can be prevented from being damaged by sliding contact with the pawls 5.

Eighth Embodiment

Figure 21:
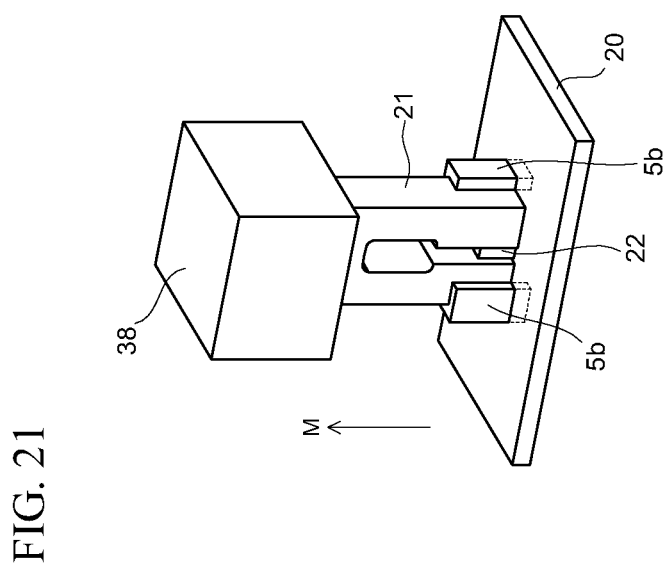
FIG. 21 is a perspective view illustrating a magnetic core according to an eighth embodiment and an area around the magnetic core.

FIG. 21 is a perspective view illustrating the magnetic core 21 according to the present embodiment and an area around the magnetic core 21.

In the present embodiment, an elastic body 38 is provided to the top surface of the magnetic core 21 as illustrated in FIG. 21. The other configuration of the present embodiment is the same as that of the fifth embodiment.

Figure 22:
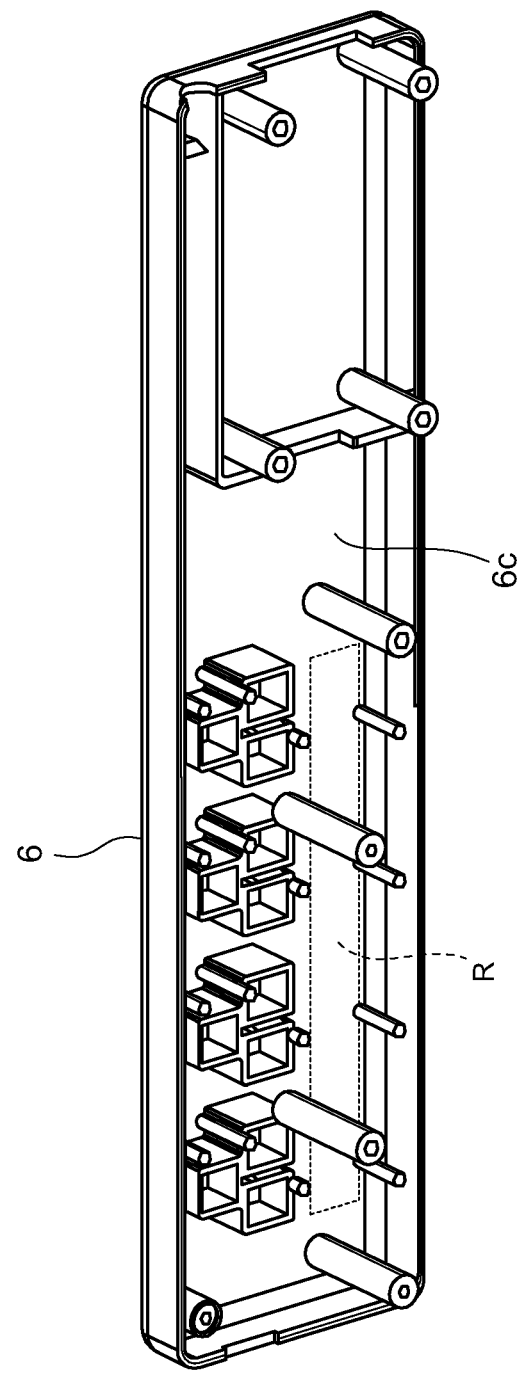
FIG. 22 is an external view illustrating an inner surface of a top cover used in the eighth embodiment.

FIG. 22 is an external view illustrating an inner surface of the top cover 6 used with the elastic body 38.

As illustrated in FIG. 22, an inner surface 6c of the top cover 6 has a partial region R with which the elastic body 38 is in contact.

The elastic body 38 has a function to press the magnetic core 21 against the first circuit board 20 while being in contact with both of the partial region R of the inner surface 6c and the top surface of the magnetic core 21.

The elastic body 38 is used to regulate the movement of the magnetic core 21 in its height direction M (see FIG. 21) of the magnetic core 21. Thus, the elastic body 38 can prevent magnetic core 21 from being displaced from the first circuit board 20.

The material of the elastic body 38 is not particularly limited, but soft sponge or rubber, which is unlikely to damage the magnetic core 21, is preferably used as the material of the elastic body 38. Further, a spring expandable in the height direction M may be used as the elastic body 38.

Note that, a single elastic body 38 may be used commonly for all of the magnetic cores 21, instead of providing the multiple elastic bodies 38 for the magnetic cores 21 as illustrated in FIG. 21.

Ninth Embodiment

Figure 23:
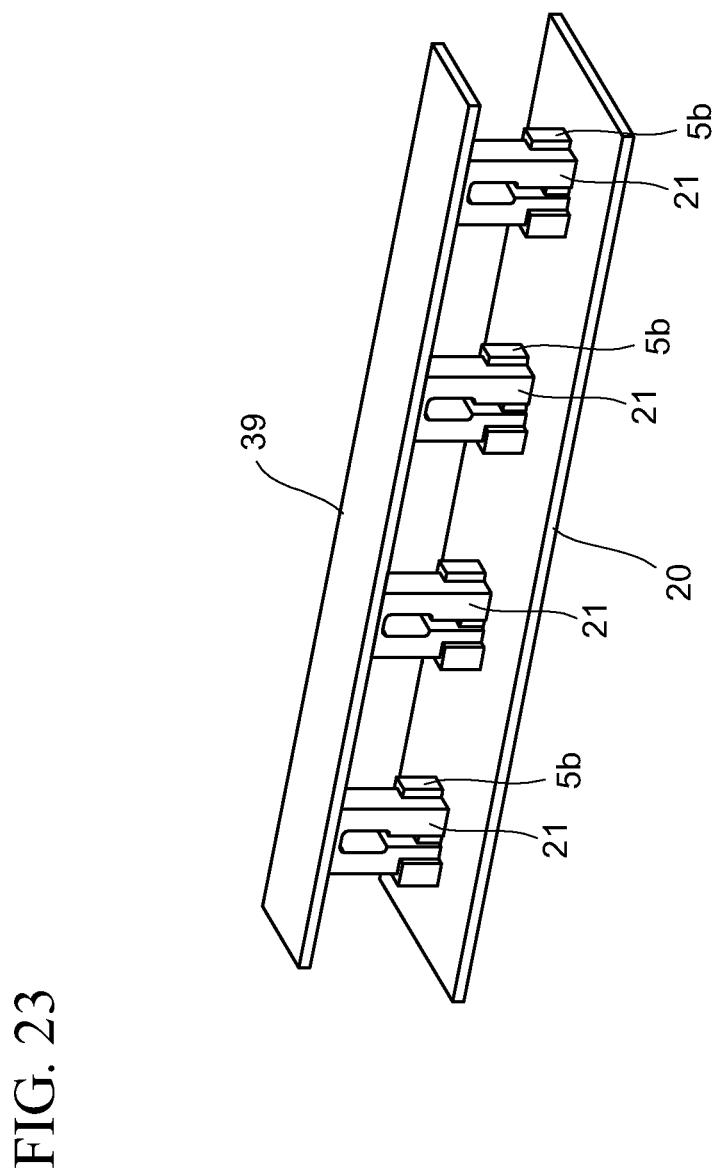
FIG. 23 is a perspective view of a first circuit board and a magnetic core in a ninth embodiment.

FIG. 23 is a perspective view of the first circuit board 20 and the magnetic core 21 in the present embodiment.

In this embodiment, as illustrated in FIG. 23, a plate 39 is provided. The plate 39 presses the multiple magnetic cores 21 against the first circuit board 20 while being in contact with the top surfaces of the multiple magnetic cores 21. The other configuration of the present embodiment is the same as that of the fifth embodiment.

Figure 24:
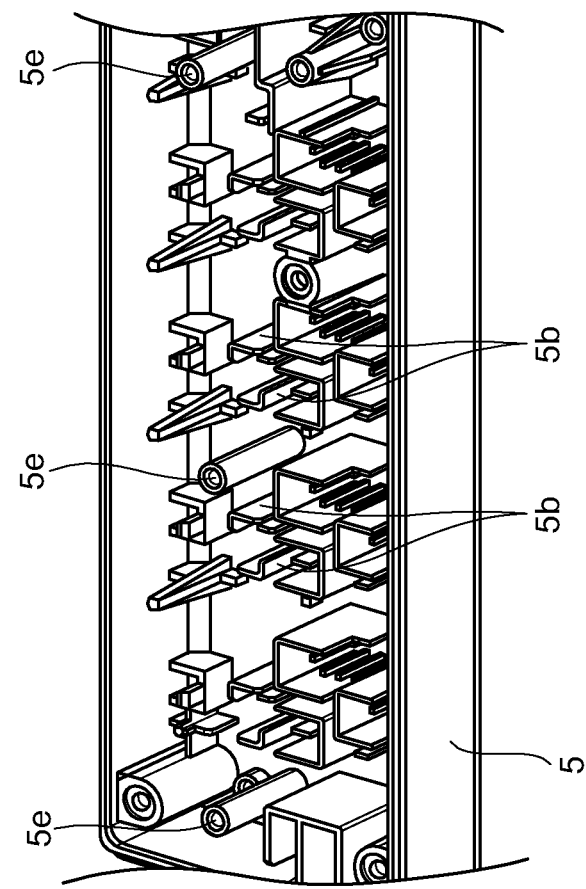
FIG. 24 is a partial perspective view illustrating a plate attachment method in the ninth embodiment (part 1)
Figure 25:
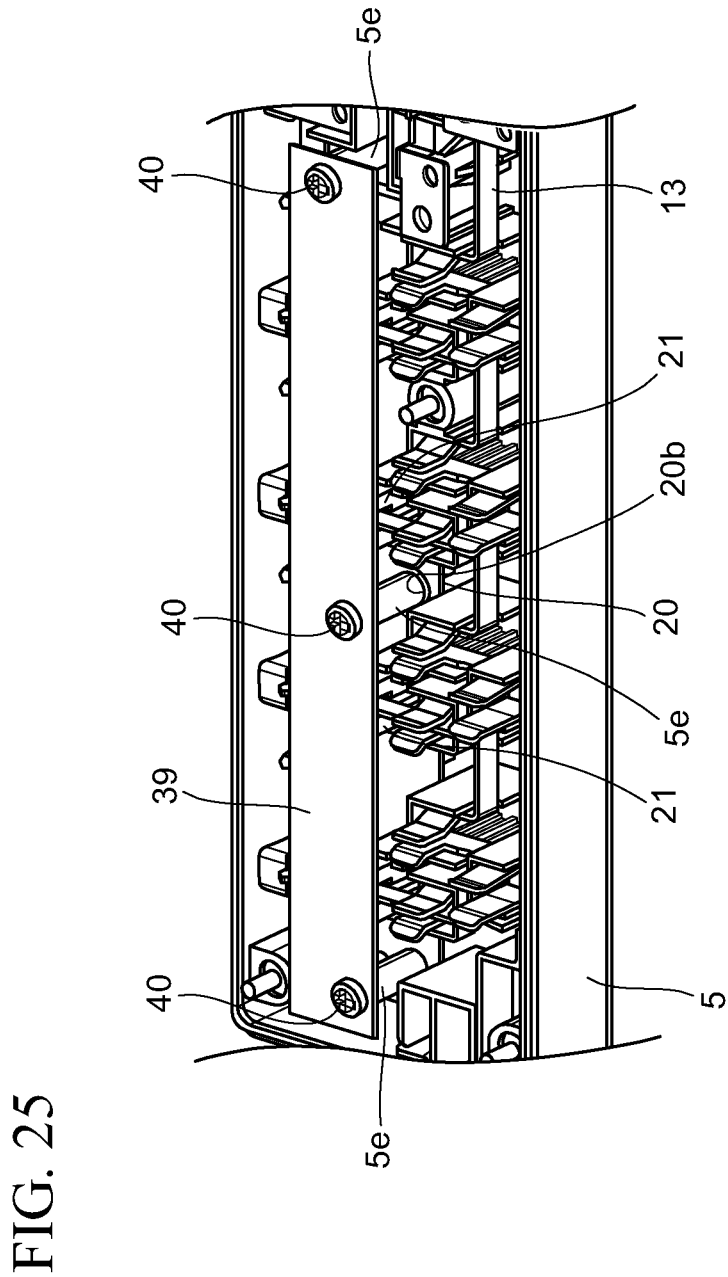
FIG. 25 is a partial perspective view illustrating a plate attachment method in the ninth embodiment (part 2)

FIGS. 24 and 25 are each perspective views illustrating an attachment method of the plate 39.

As illustrated in FIG. 24, projections 5e each including a screw hole formed therein are provided on the inner surface of the bottom cover 5.

As illustrated in FIG. 25, the projections 5e are inserted through openings 20b of the first circuit board 20 and then fixed to the plate 39 by screws 40.

The plate 39 is used to regulate the movement of the magnetic cores 21 in it height direction. Thus, the plate 39 can prevent the magnetic cores 21 from being displaced from the first circuit board 20.

The material of the plate 39 is not particularly limited, but a resin plate is preferably used as the material of the plate 39 in consideration of preventing the magnetic cores 21 from being damaged when the plate 39 is brought in contact with the magnetic cores 21.

Tenth Embodiment

Figure 26:
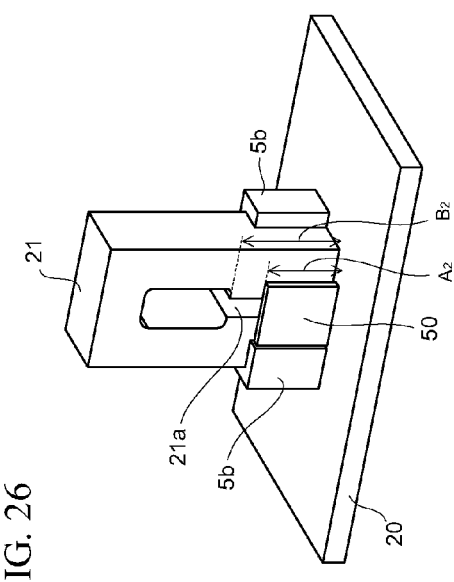
FIG. 26 is a perspective view of a magnetic core according to a tenth embodiment.
Figure 27:
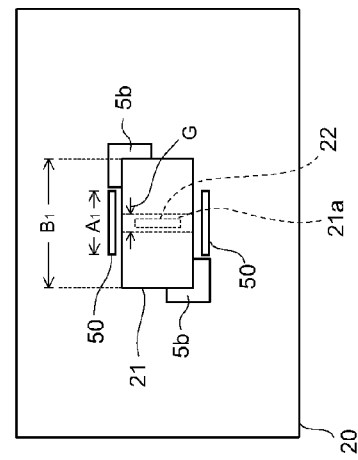
FIG. 27 is a top view of the magnetic core according to the tenth embodiment.

FIG. 26 is a perspective view of the magnetic core 21 according to the present embodiment, and FIG. 27 is a top view of thereof.

As illustrated in FIGS. 26 and 27, magnetic shields 50 are vertically stood on the first circuit board 20 in the present embodiment. The other configuration of the present embodiment is the same as that of the fifth embodiment.

Each of the magnetic shields 50 is provided beside the gap 21a of the magnetic cores 21, and functions to prevent an unnecessary magnetic field from entering into the gap 21a from outside of the magnetic core 21.

As a material of the magnetic shield 50 having such a function, a material having a high magnetic permeability can be used, for example. The material having a high magnetic permeability has a characteristic of capturing an external magnetic field and allowing the external magnetic field to penetrate the material itself. Accordingly, when the material having a high magnetic permeability is used as the material of the magnetic shield 50, the magnetic shield captures an external magnetic field attempting to enter the gap 21a. Thus, a reduction in the measurement accuracy of the magnetic field by the hall element 22 due to the external magnetic field can be prevented.

Among the materials having a high magnetic permeability, a ferromagnetic material having a high permeability and a high saturation magnetic flux density and having a low retention force is preferably used as the material of the magnetic shield 50. As an example of such a material, electromagnetic soft iron, electromagnetic steel sheet, permalloy alloy, an amorphous material of a compound of iron, silicon and boron, and a microcrystalline ribbon obtained by causing the amorphous material to crystallize and the like can be used.

In addition, the magnetic shields 50 may be fixed onto the first circuit board 20 by any method such as adhering, soldering or the like.

Note that, each of the magnetic shields 50 is preferably formed in a size within a range large enough to effectively prevent the external magnetic field from entering into the gaps 21a. For example, a width $A_1$ of the magnetic shield 50 is preferably larger than the width G of the gap 21a but smaller than a width $B_1$ of the magnetic core 21. In addition, a height $A_2$ of the magnetic shield 50 is preferably larger than the height of the hall element 22 but smaller than a height $B_2$ of the gap 21a.

Eleventh Embodiment

Figure 28:
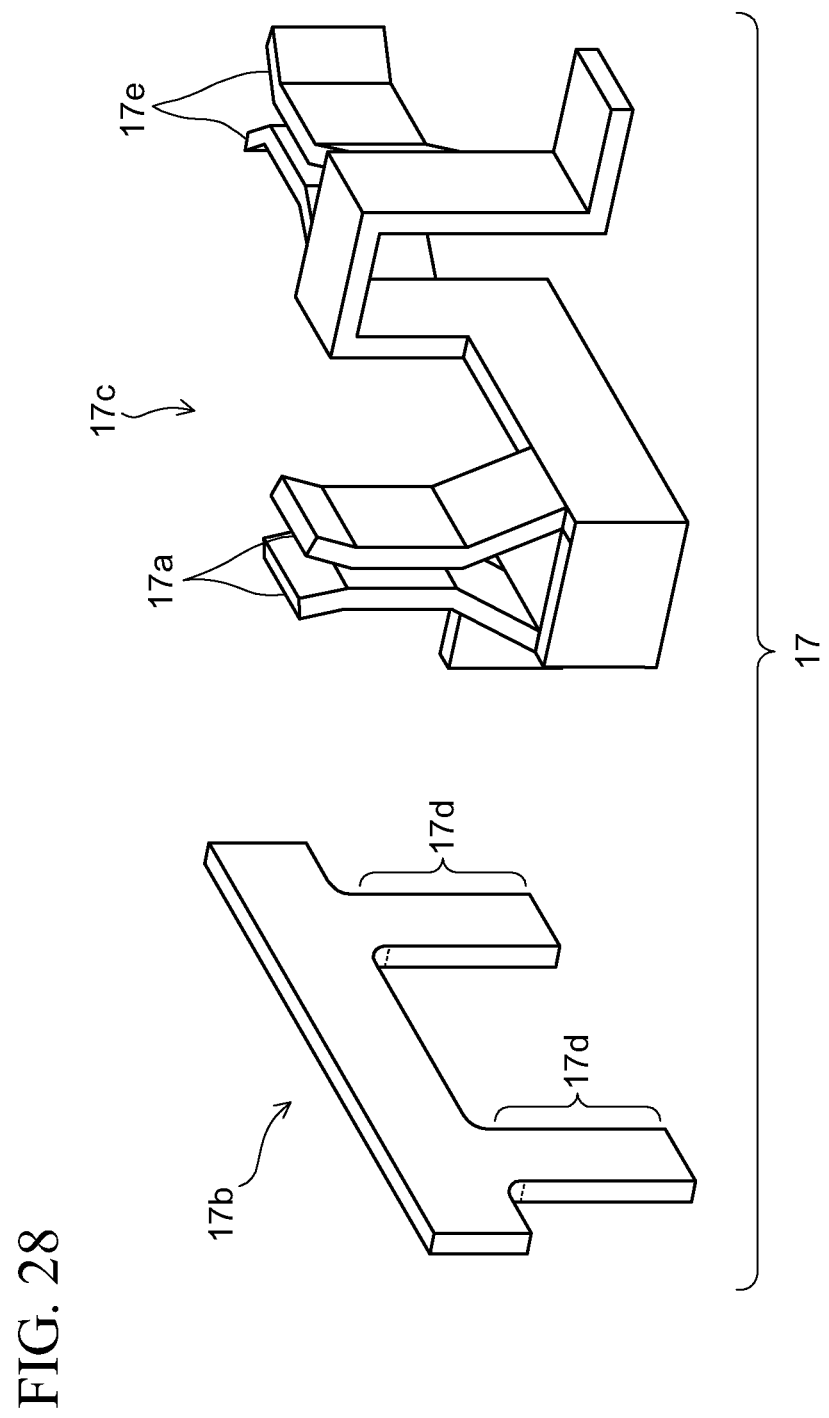
FIG. 28 is a perspective view illustrating portions of a distribution bar according to an eleventh embodiment.

FIG. 28 is a perspective view illustrating portions of the distribution bar 17 according to the present embodiment. The present embodiment is different from the first embodiment only in the form of the distribution bar 17, and the other configuration of the embodiment is the same as that of the first embodiment.

As illustrated in FIG. 28, the distribution bar 17 is separated into a sensing portion 17*b* and a contact portion 17*c* in the present embodiment.

Among these portions, the sensing portion 17*b* is provided with posts 17*d*. Meanwhile, the contact portion 17*c* is provided with a pair of holding pieces 17*e* in addition to the pair of second contacts 17*a*.

Figure 29:
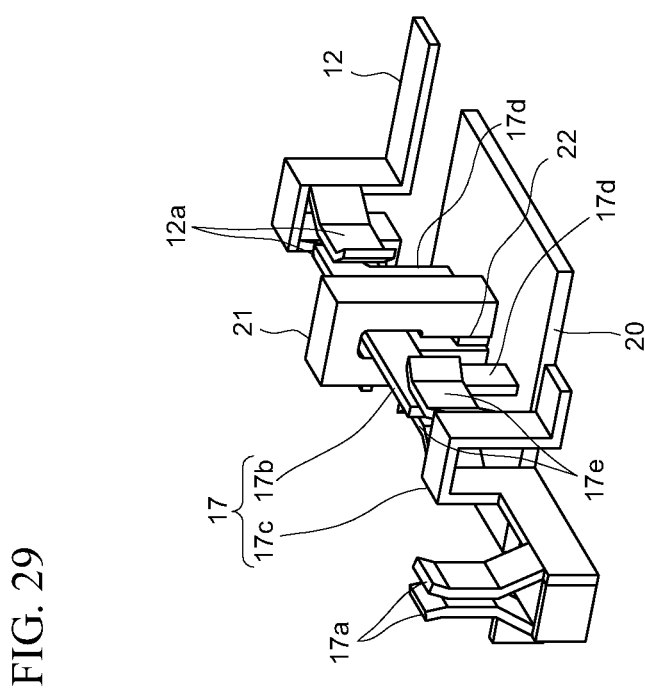
FIG. 29 is a perspective view illustrating a state where the portions of the distribution bar are assembled into a unit in the eleventh embodiment.

FIG. 29 is a perspective view illustrating a state where the portions 17*b* and 17*c* are assembled into a unit.

As illustrated in FIG. 29, one end of the sensing portion 17*b* is held between the pair of holding pieces 17*e* of the contact unit 17*c*, while the other end thereof is held between the pair of holding pieces 12*a* of the second busbar 12.

Moreover, the posts 17*d* of the sensing portion 17*b* are fixed onto the first circuit board 20 by adhering, soldering or the like.

Figure 30:
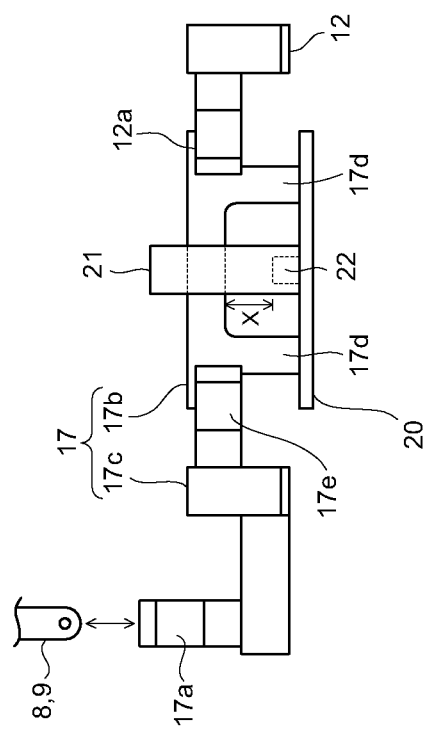
FIG. 30 is a side view illustrating a state where the portions of the distribution bar are assembled into a unit in the eleventh embodiment.

FIG. 30 is a side view illustrating a state where the portions 17*b* and 17*c* are assembled into a unit.

As described above, the posts 17*d* are fixed onto the first circuit board 20 in the present embodiment. Thus, even if a force is applied to the sensing portion 17*b* when the plug blade 8 or 9 is inserted into or removed from the pair of first contacts 17*a*, a distance X between the sensing portion 17*b* and the hall element 22 does not change.

Thus, it is possible to prevent a fluctuation in the magnetic field intensity at a portion of the sensing portion 17*b* where the hall element 22 exists due to a change in the distance X.

Twelfth Embodiment

In the present embodiment, a method of manufacturing the first to third busbars 11 to 13 described in the first embodiment is described.

Figure 31:
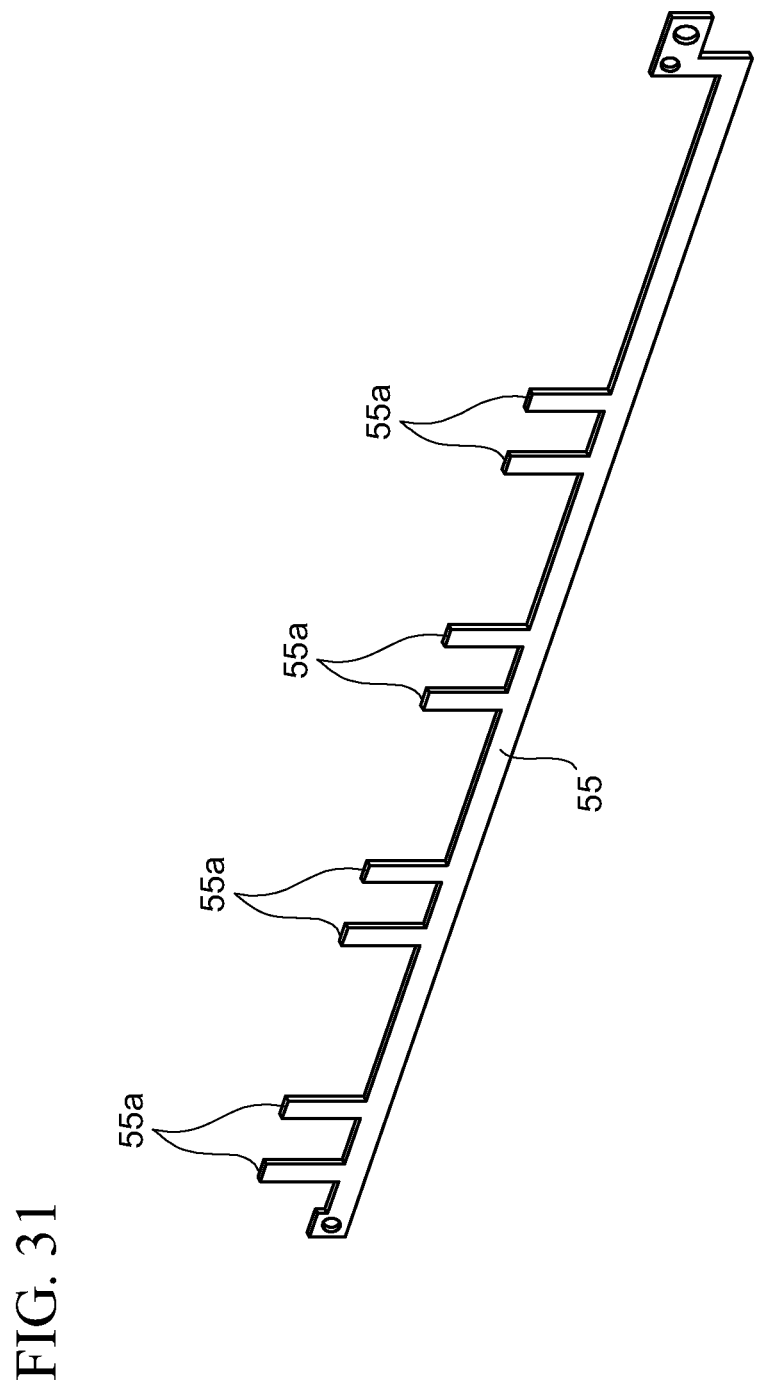
FIG. 31 is a perspective view of a conductive plate serving as a source of each busbar in a twelfth embodiment.

FIG. 31 is a perspective view of a conductive plate 55 serving as an original plate for the busbars 11 to 13.

The conductive plate 55*a* is formed by processing a brass plate with a mold and provided with multiple projections 55*a*.

Figure 32:
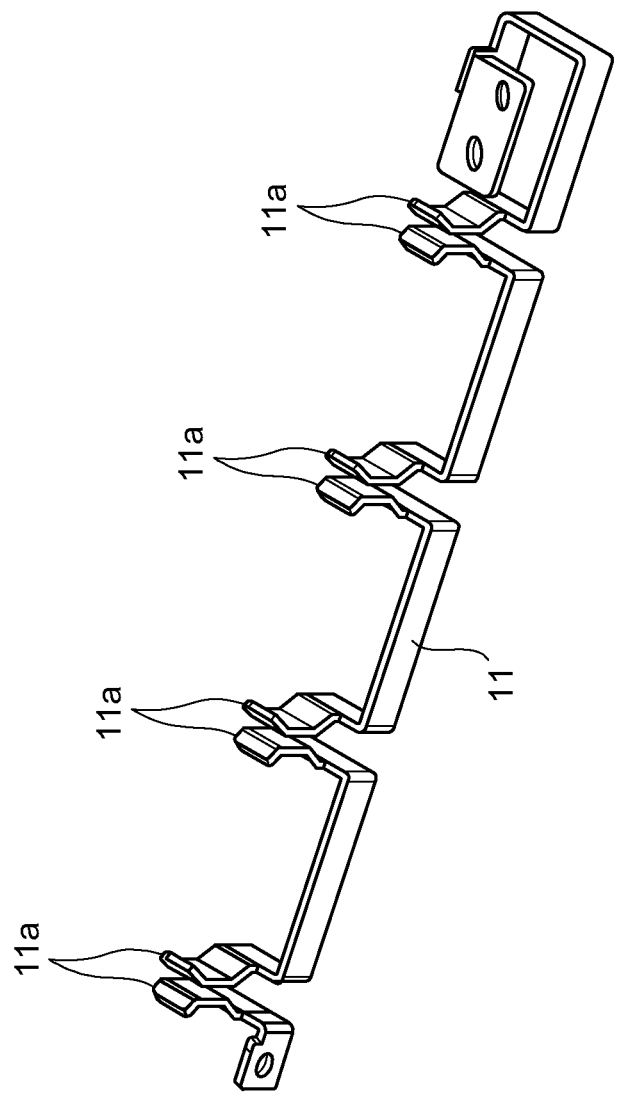
FIG. 32 is a perspective view of a first busbar obtained by subjecting the conductive plate to a bending process in the twelfth embodiment.
Figure 33:
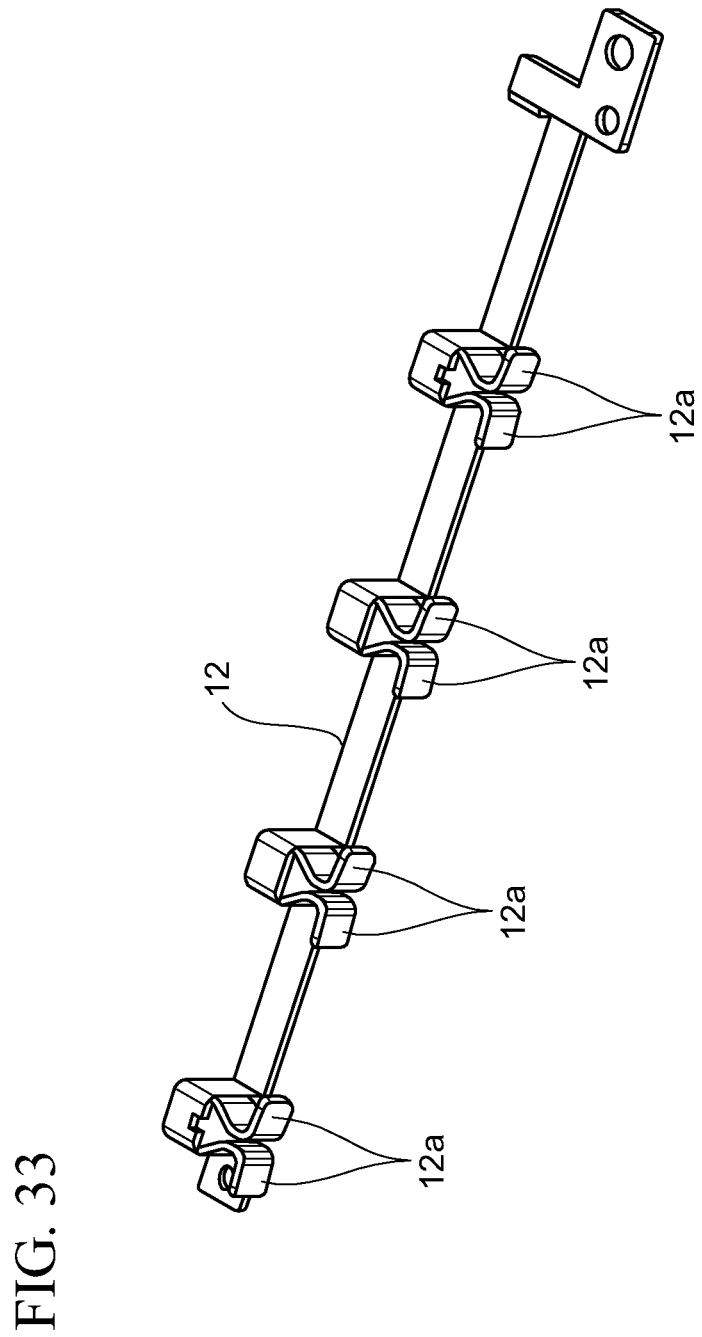
FIG. 33 is a perspective view of a second busbar obtained by subjecting the conductive plate to a bending process in the twelfth embodiment.
Figure 34:
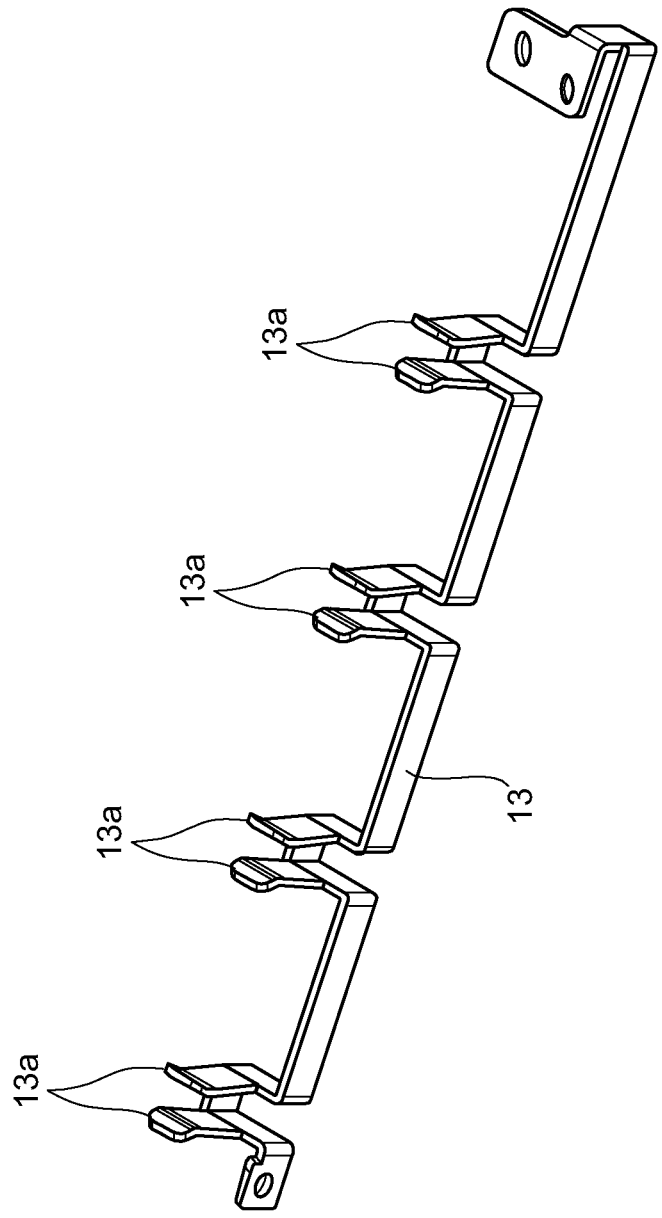
FIG. 34 is a perspective view of a third busbar obtained by subjecting the conductive plate to a bending process in the twelfth embodiment.

FIGS. 32 to 34 are perspective views of the first to third busbars 11 to 13 obtained by subjecting the conductive plate 55 to a bending process.

As illustrated in FIGS. 32 to 34, by the aforementioned bending process, the multiple projections 55*a* are formed into the first contacts 11*a* provided integrally with the first busbar 11, the second contacts 12*a* provided integrally with the second busbar 12, or the third contacts 13*a* provided integrally with the third busbar 13.

In this manner, it is possible to easily manufacture the first to third busbars 11 to 13 by changing the portions to be bent or the bending direction of the single flat conductive plate 55 in this embodiment. Thus, the manufacturing cost of the first to third busbars 11 to 13 can be inexpensive.

Figure 35:
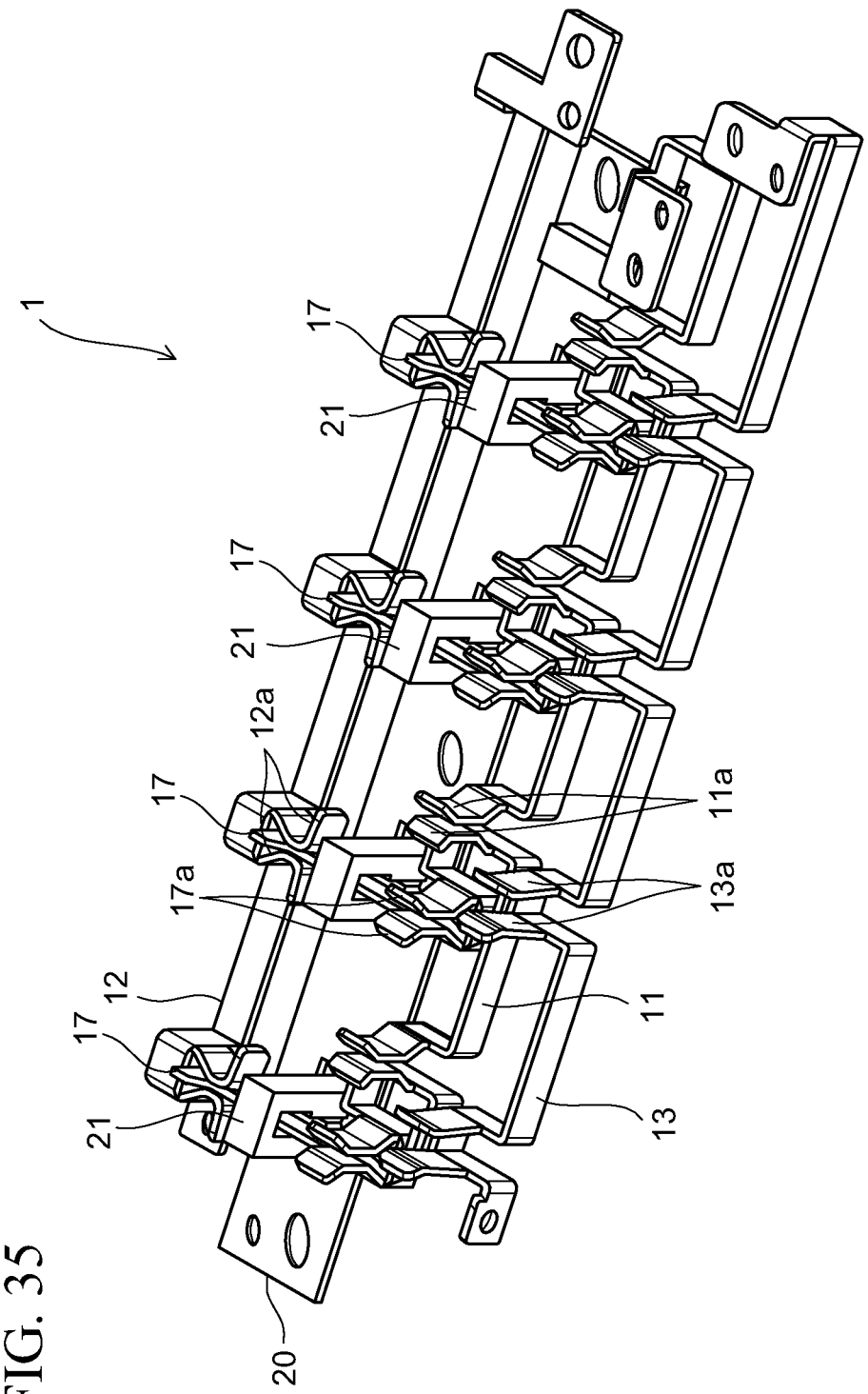
FIG. 35 is a perspective view of a power strip according to the twelfth embodiment.

FIG. 35 is a perspective view of the power strip 1 including the first to third busbars 11 to 13 manufactured by the aforementioned manner. Here, illustration of the covers 5 and 6 (see FIG. 1) is omitted in FIG. 35.

In this embodiment, the manufacturing cost of the busbars 11 to 13 can be inexpensive as described above. Thus, a reduction in the cost of the power strip incorporating the busbars 11 to 13 therein can be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A power strip comprising:
    a busbar electrically connected to a power source;
    a plurality of electrical outlets into which a power plug is respectively insertable;
    a plurality of distribution bars each of which are branched out from the busbar, corresponds to one of the electrical outlets, and respectively supply the corresponding electrical outlet with electric currents of the power source;
    a plurality of electric current measurement units respectively measuring the electric current flowing through the corresponding distribution bar; and
    a circuit board provided with the plurality of electric current measurement units,
    wherein, the electric current measurement unit includes:
    a magnetic core formed in a substantially ring shape, surrounding the corresponding distribution bar, including a gap formed between both end surfaces of the magnetic core and attached onto the circuit board such that the magnetic core is stood upright on the circuit board with the gap positioned where the magnetic core meets the circuit board, and
    a hall element provided in the gap, attached onto the circuit board and detecting a magnetic field component perpendicular to a magnetic sensitive surface in a magnetic field penetrating the hall element,
    wherein each of the plurality of distribution bars extends in a direction perpendicular to an extending direction of the busbar,
    the corresponding distribution bar goes straight through an opening of the magnetic core above the hall element, and
    the magnetic sensitive surface of the hall element is perpendicular to the extending direction of the busbar.

2. The power strip according to claim 1, further comprising an arithmetic unit to multiply a voltage of the power source and each of the electric currents respectively measured by the plurality of electric current measurement units, and thereby to calculate an amount of power consumed by each of a plurality of electronic devices connected respectively to the plurality of electrical outlets.

3. An electric power measurement system comprising:
    a plurality of electric current measurement units each corresponds to one of distribution bars which are branched out from a busbar of a power strip and supplied corresponding electrical outlet with an electric power, and is configured to measure an electric current flowing through the corresponding distribution bar;
    a processor; and
    a storing unit that stores program causing the processor to perform a process to multiply a voltage of the electric power and each of the measured electric currents, and to calculate an amount of power consumed by each electronic device connected respectively to any of the plurality of electrical outlets,
    wherein, the electric current measurement unit includes:
    a magnetic core formed in a substantially ring shape, surrounding the corresponding distribution bar, including a gap formed between both end surfaces of the magnetic core and attached onto a circuit board such that the magnetic core is stood upright on the circuit board with the gap positioned where the magnetic core meets the circuit board, and a hall element provided in the gap, attached onto the circuit board and detecting a magnetic field component perpendicular to a magnetic sensitive surface in a magnetic field penetrating the hall element, wherein each of the plurality of distribution bars extends in a direction perpendicular to an extending direction of the busbar, the corresponding distribution bar goes straight through an opening of the magnetic core above the hall element, and the magnetic sensitive surface of the hall element is perpendicular to the extending direction of the busbar.

4. The power strip according to claim 1, a bottom surface of the magnetic core, the bottom surface including the gap, is in contact with the circuit board.

* * * * *